(12) United States Patent
Darwhekar et al.

(10) Patent No.: US 11,500,336 B1
(45) Date of Patent: Nov. 15, 2022

(54) METHODS AND APPARATUS FOR LOW JITTER FRACTIONAL OUTPUT DIVIDERS

(71) Applicant: Texas Instruments Incorporated, Dallas, TX (US)

(72) Inventors: Yogesh Darwhekar, Bangalore (IN); Subhashish Mukherjee, Bangalore (IN); Narala Raghavendra Reddy, Andhra Pradesh (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/317,628

(22) Filed: May 11, 2021

(51) Int. Cl.
| | | |
|---|---|---|
| *H03M 1/50* | (2006.01) |
| *G04F 10/00* | (2006.01) |
| *G06F 1/08* | (2006.01) |
| *H03M 3/00* | (2006.01) |
| *G04G 3/02* | (2006.01) |

(52) U.S. Cl.
CPC ............ *G04F 10/005* (2013.01); *G04G 3/02* (2013.01); *G06F 1/08* (2013.01); *H03M 3/382* (2013.01); *H03M 1/50* (2013.01)

(58) Field of Classification Search
CPC .......... G04F 10/005; G04G 3/02; G06F 1/08; H03M 3/382; H03M 1/50
See application file for complete search history.

(56) References Cited

U.S. PATENT DOCUMENTS

2011/0032013 A1* 2/2011 Nelson ................. H03L 7/0994
327/156
2018/0131378 A1 5/2018 Haroun et al.

OTHER PUBLICATIONS

Zhang et al., "TI BAW technology enable ultra-low jitter clocks for high speed networks," Texas Instruments, Feb. 2019, 11 pages.

* cited by examiner

*Primary Examiner* — Joseph J Lauture
(74) *Attorney, Agent, or Firm* — Mark A. Valetti; Charles A. Brill; Frank D. Cimino

(57) ABSTRACT

An example digital to time converter includes: a first switch having a first terminal, a second terminal, and a first control terminal configured to receive a control signal. A second switch having a third terminal coupled to second terminal, a fourth terminal, and a second control terminal configured to receive a divided clock signal. A third switch having a fifth terminal coupled to the second terminal and the third terminal, a sixth terminal, and a third control terminal configured to receive an inverted version of divided clock signal. A fourth switch having a seventh terminal coupled to the second terminal, an eighth terminal, and a fourth control terminal configured to receive an inverted version of control signal. A fifth switch having a ninth terminal coupled to the eighth terminal and a fifth control terminal configured to receive the inverted divided clock signal. A capacitor coupled to the sixth terminal.

20 Claims, 12 Drawing Sheets

US 11,500,336 B1

METHODS AND APPARATUS FOR LOW JITTER FRACTIONAL OUTPUT DIVIDERS

TECHNICAL FIELD

This description relates generally to fractional output dividers, and more particularly to methods and apparatus for low jitter fractional output dividers.

BACKGROUND

A fractional output divider is a circuit that takes an input clock signal and generates an output signal that is fractionally divided version of the input clock signal. Fractional output dividers are used for applications that require a timing signal to operate, such as a microcontroller, a radio, a clock, etc. Such applications may require precise timing signals for operation and, thus, the fractional output divider needs to generate the output signal with low jitter and high accuracy.

SUMMARY

For methods and apparatus for low jitter fractional output dividers, an example digital to time converter (DTC) includes a first switch having a first terminal, a second terminal, and a first control terminal configured to receive a control signal. The example apparatus includes a second switch having a third terminal coupled to second terminal, a fourth terminal, and a second control terminal configured to receive a divided clock signal. The example apparatus includes a third switch having a fifth terminal coupled to the second terminal and the third terminal, a sixth terminal, and a third control terminal configured to receive an inverted version of the divided clock signal. The example apparatus includes a fourth switch having a seventh terminal coupled to the second terminal, an eighth terminal, and a fourth control terminal configured to receive an inverted version of the control signal. The example apparatus includes a fifth switch having a ninth terminal coupled to the eighth terminal and a fifth control terminal configured to receive the inverted version of the divided clock signal. The example apparatus includes a capacitor coupled to the sixth terminal.

DETAILED DESCRIPTION

Figure 1:
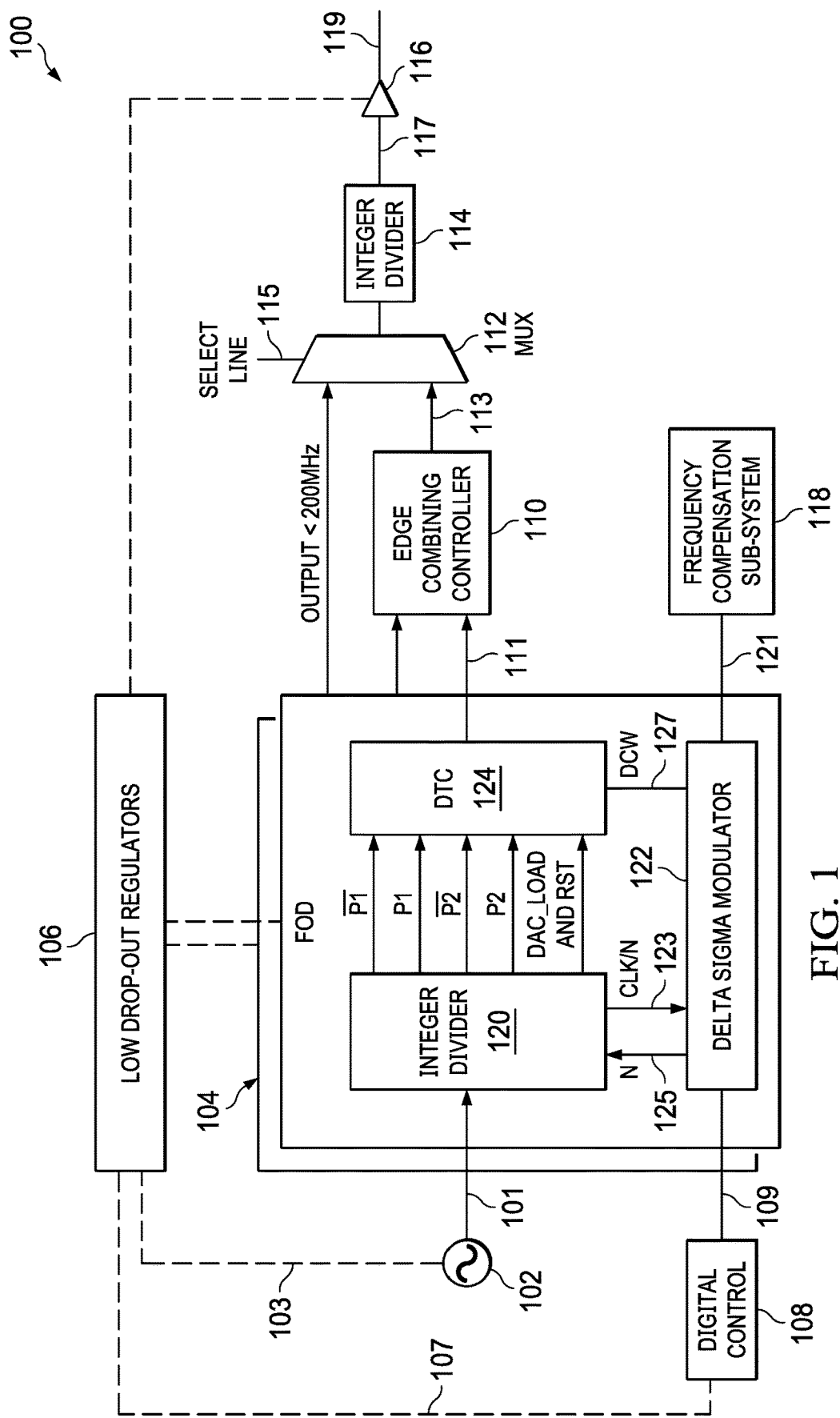
FIG. 1 is a block diagram of an example oscillator system to generate a timing signal.

The drawings are not necessarily to scale. Generally, the same reference numbers (or other reference designators) in the drawing(s) and this description refer to the same or similar (functionally and/or structurally) features. Although the drawings show layers and regions with clean lines and boundaries, some or all of these lines and/or boundaries may be idealized. In reality, the boundaries and/or lines may be unobservable, blended and/or irregular.

System on a chip (SoC) manufacturers have desired to replace crystal oscillators with bulk acoustic wave (BAW) oscillators. The crystal oscillator supplies one or more periodic oscillating signals to SoCs for various purposes. The crystal oscillator can be expensive and typically requires a greater area size than the BAW oscillator. For SoC devices, the crystal oscillator is one of few external circuits needed for operation and, thus, the crystal oscillator typically dictates the size of the SoC. The BAW oscillator is smaller and can be integrated with the SoC (e.g., the BAW oscillator does not need to be external to the SoC). However, current BAW oscillators have poor frequency accuracy and the frequency varies with temperature.

In some examples, pullable BAW oscillators are used to replace crystal oscillators. Pullability refers to frequency shift (deviation) as a function of the control voltage, expressed in parts per million (ppm). Absolute pull range (APR), also referred to as tracking range, is a specified pullable frequency shift (ppm) from a nominal, target frequency over operating parameters, such as frequency tolerance, frequency stability over operating temperature range, supply voltage, output load and aging. A pullable BAW oscillator is based on a BAW resonator and a voltage-controlled variable load capacitance. Such a pullable BAW oscillator has a limited range of pulling, so the pullable BAW oscillator is limited to a certain number of frequencies. For example, the pullable BAW oscillator output frequency is given in part by a capacitor, which is varied to make the output frequency come back to the desired frequency. However the value of the capacitor cannot arbitrarily change. Therefore, after a certain point (e.g., a certain frequency), the circuit (e.g., the pullable BAW oscillator) does not oscillate, which is why there is a limit to the amount of frequency the pullable BAW oscillator can output.

In some examples, fractional output dividers (FOD) and/or fractional frequency dividers (FFD) are used in general purpose oscillators to replace crystal oscillators. The term FOD is interchangeable with FFD and is used herein out to refer to a device, circuitry, a block, etc., that generates an output frequency equal to a specified fraction of an input clock signal. In some examples, typical and/or conventional FODs cannot be used to replace the crystal oscillator because the jitter is very high. Jitter and/or clock jitter are terms used to describe clock signal quality. For example, jitter is an amount of deviation from the desired frequency over time. Jitter typically is defined/measured in time domain, such as period jitter, cycle-to-cycle jitter, and accumulated jitter. For example, an oscillator outputs a clock signal that is equivalent to 100 MHz. On a plot of frequency vs time, the frequency is a straight line for an ideal oscillator. However, in reality, there is jitter that causes the frequency to vary from the 100 MHz and, thus, the line is not a perfectly straight line. Jitter can also be defined/measured in a frequency domain, such as integrated rms (root mean square) jitter, which is calculated based on measured phase noise spectrum. The general purpose oscillators that utilize conventional FODs have high jitter due to noise in the circuit implementing the oscillator. Crystal oscillators have good jitter (e.g., low jitter). Therefore, the general purpose oscillator utilizing the conventional FOD implementation cannot be used to replace the crystal oscillator.

Examples disclosed herein include an oscillator system that implements BAW circuitry with an FOD to compensate for jitter, poor frequency accuracy, and limited frequency ranges. The example FOD disclosed herein improves jitter compared to the FODs implemented by general purpose oscillators. The example oscillator disclosed herein can be used to replace the crystal oscillator due to its nature of improving jitter. For example, the oscillator disclosed herein lowers jitter to 100 femtoseconds, wherein the 100 femtoseconds of jitter includes random jitter and deterministic jitter (e.g., spurs). Jitter has two parts: 1) jitter can vary randomly or 2) jitter can vary in a periodic manner. In the second part, the deviation of frequency from the target frequency can be predicted (e.g., at what time will the frequency deviate from the target frequency).

Examples disclosed herein include circuitry that improves the FOD relative to FODs utilized by general purpose oscillators. For example, examples disclosed herein correct gain errors and integral nonlinearity (INL) of the FOD, improve systematic INL of the FOD through a split commutation switch approach, eliminate memory induced INL of the FOD through a dynamic reset comparator scheme, and enable the FOD to output higher frequencies relative to conventional FODs by implementing edge combining methods. Such improvements described above described in further detail below in connection with the figures and corresponding description.

FIG. 1 illustrates a block diagram of an example oscillator system 100 to generate a desired timing signal. The example oscillator system 100 includes an example oscillator 102, one or more example fractional output divider (FOD) 104, an example low dropout regulator (LDO) 106, example digital control circuitry 108, an example edge combining controller 110, an example multiplexer (MUX) 112, an example integer divider 114, an example output driver 116, and an example frequency compensation sub-system 118. Each example FOD 104 includes an example integer divider 120, an example delta sigma modulator (DSM) 122, and an example digital to time converter (DTC) 124. The example oscillator system 100 may be fabricated on a single integrated circuit (IC) utilizing, for example, known or later developed semiconductor processor techniques.

In FIG. 1, the example oscillator system 100 includes the oscillator 102 to generate an input clock signal 101. The oscillator 102 is a bulk acoustic wave (BAW) oscillator. The BAW oscillator is an electronic oscillator circuit that uses mechanical resonance of a vibrating micro-acoustic resonator to generate an electrical signal through a piezoelectric effect. The input clock signal 101, at high frequency, provides the clocking and timing reference for electronic systems. The oscillator 102 is coupled to the integer divider 120 of the fractional output divider 104 to provide the input clock signal 101 to the integer divider 120. The oscillator 102 is powered by the example LDO 106. The LDO 106 provides a regulated voltage to the oscillator 102 via output 103 to enable the oscillator 102 to generate the input clock signal 101.

In FIG. 1, the example oscillator system 100 includes the FODs 104, each generating an intermediate signal 111 that has a frequency equal to a specified fraction of the input clock signal 101. In some examples, the intermediate signal 111 is a divided clock signal, such that the input clock signal 101 is divided at the intermediate signal 111. The FODs 104 utilize the integer divider 120, the DSM 122, and the DTC 124 to generate arbitrary divided frequencies from the oscillator 102. In this example, two FODs 104 are illustrated. Additionally and/or alternatively, the oscillator system 100 can have multiple FODs operating in congruence (e.g., parallel) with each other to synthesize edges of the output intermediate signals 111 in order to generate a higher frequency clock waveform. In this example, when the frequency of the intermediate signal 111 is less than 200 MHz, a single FOD 104 is used. In some examples, when the frequency of the intermediate signal 111 is less than 400 MHz and greater than 200 MHz, two FODs 104 are used. For purposes of explanation, a single FOD 104 will be described.

The FOD 104 includes an input for the input clock signal 101, one or more inputs for control parameters to control the delta sigma modulator 122, and an input for LDO 106 to supply regulated power to the integer divider 120 and the DTC 124. The output of the FOD 104 is coupled to the input of the edge combining controller 110 to provide the intermediate signal 111 to the edge combining controller 110. In some examples, the output of the FOD 104 is coupled to the MUX 112.

The example oscillator system 100 includes the example LDO 106 to provide regulated power to the blocks of the oscillator system 100. The example LDO 106 implements a number of different regulators for the number of different blocks in the oscillator system 100. For example, the oscillator 102, the digital control circuitry 108, the FOD 104, the output driver 116, and/or the frequency compensation sub-system 118 may obtain custom power from sub components (e.g., custom LDOs) of the LDO 106.

In FIG. 1, the example oscillator system 100 includes the example digital control circuitry 108 to select a particular divider ratio between the output clock signal 119 and the input clock signal 101. The digital control circuitry 108 may include registers that are loaded by software and/or firmware that is executed on a processor that is coupled to FOD 104. The digital control circuitry 108 is coupled to the LDO 106 to receive and/or obtain a digital LDO input 107. The digital control circuitry 108 is coupled to the DSM 122 to output digital control outputs 109 configured to set the divider ratio for the integer divider 120. For example, the digital control outputs 109 include a frequency control word (FCW) that controls the divider ratio to divide the input clock signal 101 and controls the amount of delay by which the DTC 124 is to apply to the clock signals output by the integer divider 120. In some examples, the digital control outputs 109 include calibration logic to calibrate the DTC 124.

In FIG. 1, the example FOD 104 includes the integer divider 120 to divide the input clock signal 101 by a particular integer value (N). The integer divider 120 includes an input that is coupled to the oscillator 102 for receiving the input clock signal 101, an input coupled to the LDO 106 for receiving regulated power, an input coupled to the DSM 122 for receiving a control parameter (N) 125 (where the value of N is different for each FOD 104 if there are multiple FODs in oscillator system 100), an output coupled to the DSM 122 for providing a divided output clock 123, and one or more outputs coupled to the DTC 124. In this example, the integer divider 120 is configured to count a number of edges of input clock signal 101 in response to the control parameter N 125 provided by DSM 122 and to produce "Nth clock" signals, $\overline{P1}$, P1, $\overline{P2}$, P2. In some examples, the control parameter N 125 is referred to as the integer divider control word (NCW). In some examples, the integer divider 120 generates DAC_LOAD & RST signals. For example, the integer divider 120 generates a separate signal from the Nth clock signals to provide to the DTC 124. The DAC_LOAD & RST signal is described in further detail below in connection with the DTC 124.

In FIG. 1, the example FOD 104 includes the DSM 122 to provide and/or generate a fractional value that is used to divide the input clock signal 101 down to the desired frequency. The example DSM 122 may be controlled and/or configured by the digital control circuitry 108. For example, the digital control circuitry 108 configures the fractional value that the DSM 122 is to provide to the integer divider 120 and the DTC 124. Additionally and/or alternatively, the DSM 122 may be controlled by the frequency compensation sub-system 118, described in further detail below. In some examples, the DSM 122 is a multi-stage noise shaping (MASH) architecture. Additionally and/or alternatively, the DSM 122 can be implemented by and/or implement any type of delta sigma converter, delta sigma modulator, etc. The DSM 122 is coupled to the digital control circuitry 108, the frequency compensation sub-system 118, the integer divider 120, and the DTC 124.

In some examples, the DSM 122 generates and/or provides the control parameter N 125 to the integer divider 120, where N is the integer portion of the fractional value by which the FOD 104 is to divide the input clock signal 101. In some examples, the DSM 122 generates a delay control word (DCW) 127. The DCW 127 is a 12-bit value, also referred to as a delay control parameter, code, DTC code, delay code, etc. The DTC 124 utilizes the DCW 127 to delay an output of Nth clock signals $\overline{P1}$, P1, $\overline{P2}$, P2. In some examples, the DCW 127 can be described as the fractional portion of the fractional value by which the FOD 104 is to use to precisely reduce the input clock signal 101 to the desired frequency. For example, if a desired frequency of the output clock signal 119 is 101 MHz and the input clock signal 101 is 1000 MHz, the input clock signal 101 is to be divided by a fractional value of 9.9. The integer portion (N) of the fractional value is "9" and the fractional portion (DCW) of the fractional value is "0.9". Therefore, the DSM 122 may provide a bitstream and/or digital value indicative of "9" to the integer divider 120 and a bitstream and/or digital value indicative of "0.9" to the DTC 124.

In this example, the combination of the integer divider 120 and the DSM 122 introduces deterministic jitter in the output clock signal 119. The deterministic jitter is a result of the integer divider 120 not being able to divide the input clock signal 101 by a fractional value. For example, in order for the FOD 104 to output a clock signal that is 101 MHz from a 1000 MHz clock input, the integer divider 120 divides the input clock signal 101 by a value of 10 (e.g., N=10) for nine cycles and a value of 9 (e.g., N=9) for one cycle (e.g., 10×9+9×1). Therefore, the output of the integer divider 120 is not a true 101 MHz. The output of the integer divider 120 is instead 100 MHz for nine cycles and 111 MHz for one cycle. The deviation of the output frequency of the integer divider 120 from 101 MHz is referred to as deterministic jitter. The example DTC 124 is included to reduce the deterministic jitter introduced by the combination of the integer divider 120 and the DSM 122.

In FIG. 1, the example FOD 104 includes the DTC 124 to generate a known amount of delay to reduce the deterministic jitter of the Nth clock signals. The DTC 124 includes an input that is coupled to the integer divider 120 to receive and/or obtain the Nth clock signals. The DTC 124 includes an input that is coupled to the DSM 122 to receive and/or obtain the DCW 127. The DTC 124 may include three supply inputs (not shown) that are coupled to custom LDOs of the LDO 106 to receive and/or obtain regulated power. The DTC 124 includes an output that is coupled to the edge combining controller 110. In some examples, the DTC 124 includes a second output that is coupled to the MUX 112. The DTC 124 operates similarly to a variable delay buffer, whose time delay is controlled using the DCW 127. The example DTC 124 obtains the Nth clock signals $\overline{P1}$, P1, $\overline{P2}$, P2 and the DCW 127. The example DTC 124 delays the output of the Nth clock signals for a period of time based on how high and/or low the frequency of the outputs of the integer divider 120 are and what the value of the DCW 127 is. In this is example, the DTC 124 outputs the intermediate signal 111 to the edge combining controller 110, which advantageously includes reduced deterministic jitter relative to the jitter of the Nth clock signals $\overline{P1}$, P1, $\overline{P2}$, P2.

In some examples, digital to time converters are linear, meaning that as the delay code and/or delay control increases, the output frequency increases linearly. Some digital to time converters are non-linear at certain delays (e.g., output frequency at a particular amount of delay does not increases or decrease linearly with that amount of delay). In some examples, this type of non-linearity is referred to as "INL" (integral non-linearity). Non-linearity may cause undesired effects to the output frequency (e.g., the output clock signal), such as a value of frequency that is not intended and/or expected at the particular delay, spurs (e.g., deterministic jitter), etc. Many types of hardware circuitry include INL that is to be compensated to ensure desirable outcomes (e.g., an intended output clock signal). In this example, the DTC 124 compensates for INL. In some examples, the digital control circuitry 108 includes calibration logic that assists in compensating for any non-linearity of the DTC 124. The example DTC 124 is described in further detail below in connection with FIGS. 2 and 3.

In FIG. 1, the example oscillator system 100 includes the edge combining controller 110 to combine clock edges of two or more intermediate signals 111. The edge combining controller 110 is coupled to the DTC 124 to receive and/or obtain the intermediate signal 111. In this example, the edge combining controller 110 is coupled to two FODs 104 and, thus, obtains two intermediate signals 111. Additionally and/or alternatively, the edge combining controller 110 can obtain any number of intermediate signals and, thus, be coupled to any number of FODs 104. In some examples, the edge combining controller 110 is a set-reset (SR) latch. In such an example, one of the FODs 104 is the input that sets the output and a different one of the FODs 104 is the input that resets the output. In some examples, the edge combining controller 110 increases and/or decreases a duty cycle of an edge combined clock signal 113 based on the intermediate signals 111 of the FODs 104. In some examples, the edge combined clock signal 113 has a frequency that is greater than the frequency of the intermediate signal 111.

In FIG. 1, the example oscillator system 100 includes the MUX 112 to select between the edge combined clock signal 113 or the intermediate signal 111 to forward to the integer divider 114. The MUX 112 is coupled to the edge combining controller 110 and to a single FOD 104. The FOD 104 provides the intermediate signal 111 to a first input of the MUX 112 and the edge combining controller 110 provides the edge combined clock signal 113 to a second input of the MUX 112. The MUX 112 includes a third input, also referred to herein as a select line, a select input, etc., to select which input to forward to the output. The select line 115 may include and/or obtain a digital input from register programming, values stored in memory accessible by the MUX 112, etc. In some examples, the digital input corresponds to a threshold frequency. For example, when the intermediate signal 111 is less than a first threshold frequency, the MUX 112 selects the intermediate signal 111 to forward to the integer divider 114. When the intermediate signal 111 is greater than the first threshold frequency and less than a second threshold frequency, the MUX 112 forwards the edge combined clock signal 113 to the integer divider 114. In some examples, the first threshold frequency is equivalent to 200 MHz and the second threshold frequency is equivalent to 400 MHz. In some examples, the first and second threshold frequencies may be of any value. In some examples, the select line 115 is configured to receive a logic signal indicative to select between the intermediate signal 111 and the edge combined output clock signal 113 for forwarding to the output.

In FIG. 1, the example oscillator system 100 includes the integer divider 114 to divide the output of the MUX 112 by any integer value between 1 and N. In some examples, the integer divider 114 is a programmable divider, such that the integer divider 114 can reduce the frequency generated by the FOD 104 and/or the edge combining controller 110 to any desired value. The integer divider 114 is coupled to the MUX 112 to obtain the intermediate signal 111 or the edge combined clock signal 113. The integer divider 114 is coupled to the output driver 116 to provide a divided clock signal 117. In some examples, the integer divider 114 is not included in the oscillator system 100. For example, some applications of the oscillator system 100 do not need further reducing and/or dividing of the intermediate signal 111.

In FIG. 1, the example oscillator system 100 includes the output driver 116 to buffer the divided clock signal 117 to the output. The output driver 116 is to drive and/or output the output clock signal 119 from the oscillator system 100. The output driver 116 is coupled to the output of the integer divider 114 to obtain the divided clock signal 117. The output driver 116 includes an output that outputs the output clock signal 119 from the oscillator system 100. In some examples, the output clock signal 119 is utilized as a timing signal for different hardware and/or software of a computing device implementing the oscillator system 100. The example output driver 116 may implement output formats such as complimentary metal-oxide-semiconductor (CMOS), low voltage CMOS (LVCMOS), and low voltage positive/pseudo emitter-coupled logic (LVPECEL) type of swings.

In FIG. 1, the example oscillator system 100 includes the frequency compensation sub-system 118 to obtain the temperature of the oscillator 102 and generate a temperature coefficient of frequency (TCF) that controls an output of the DSM 122. For example, the frequency compensation sub-system 118 may define and/or determine a temperature-based frequency control word (FCW) input 121, utilized by the DSM 122 to generate the delay control word (DCW) 127 for the DTC 124, based on the TCF of the oscillator 102. The frequency compensation sub-system 118 obtains temperature measurements from a temperature sensor that monitors and/or measures the temperature of the oscillator 102. In some examples, the frequency compensation sub-system 118 obtains temperature measurements from any other type of source monitoring temperature of the oscillator 102. The example frequency compensation sub-system 118 uses temperature to drive the output of the DSM 122 because the oscillator frequency (e.g., the input clock signal 101) is a function of temperature. The frequency compensation sub-system 118 therefore senses the frequency change with temperature and feeds it to the DSM 122 to correct and/or compensate that frequency deviation. In some examples, the frequency compensation sub-system 118 may not be utilized to determine the temperature-based FCW input 121 for the DSM 122. The frequency compensation sub-system 118 is coupled to the DSM 122 to provide the temperature-based FCW input 121.

In an example operation of the oscillator system 100, the oscillator 102 generates the input clock signal 101. The input clock signal 101 is to be divided down to a desired output clock signal 119. The digital control circuitry 108 selects the divider ratio (e.g., the control parameter N 125 and the DCW 127) that is to be used by the FODs 104 for generating the desired output clock signal 119. The digital control circuitry 108 outputs digital control outputs 109, that include the control parameter N 125 and the DCW 127, to the FODs 104. The FODs 104 operate in parallel, where one FOD 104 generates a delay (e.g., outputs an intermediate signal 111) responsive to obtaining the input clock signal 101 and the digital control outputs 109 and a different FOD 104 loads the digital control outputs 109. The intermediate signals 111 have frequencies equal to the specified fraction of the input clock signal 101.

In some examples, the edge combining controller 110 obtains the intermediate signals 111 and combines the edges of the intermediate signals 111 to generate a higher frequency of the intermediate signal 111. The edge combined clock signal 113 is fed into the MUX 112 along with one of the intermediate signals 111. The MUX 112 selects the edge combined clock signal 113 or the intermediate signal 111 responsive to a control value on the select line 115. For example, the select line 115 compares the two inputs (e.g., the edge combined clock signal 113 and the intermediate signal 111) to one or more threshold frequencies to determine which input to forward to the integer divider 114. In some examples, when the intermediate signal 111 is less than a first frequency threshold, the select line 115 forwards the intermediate signal 111 to the integer divider 114. In some examples, when the intermediate signal 111 is greater than the first frequency threshold but less than a second frequency threshold, the select line 115 forwards the edge combined clock signal 113 to the integer divider 114.

The integer divider 114 outputs a divided clock signal 117 based on the signal that the MUX 112 forwards. For example, the integer divider 114 divides the output signal of the MUX 112 by any integer value intended to create a desired clock signal. The output driver 116 obtains the divided clock signal 117 and buffers it to output the output clock signal 119. The output clock signal 119 includes low jitter relative to timing signals generated by fractional frequency dividers not having the DTC 124, digital control circuitry 108, and LDOs 106.

In the example operation of the oscillator system 100, the integer divider 120 periodically provides a DAC_LOAD & RST signal to the DTC 124. In some examples, the integer divider 120 aperiodically provides the DAC_LOAD & RST signal to the DTC 124. The DAC_LOAD & RST signal indicates to the DTC 124 that it is time to check for a new DCW 127. For example, the DAC_LOAD & RST signal informs the DTC 124 to load a new delay code and reset the output of the output driver 116. In some examples, the integer divider 120 obtains a notification and/or any type of indication from the DSM 122 that a new DCW 127 is to be loaded. Additionally and/or alternatively, the integer divider 120 periodically reminds the DTC 124 to check for a new DCW 127 to load. In some examples, a DCW 127 changes when a different frequency is desired. Additionally and/or alternatively, the DCW 127 changes when the FODs 104 need to compensate for non-linearity, correct gain of the FOD 104, etc.

Figure 2:
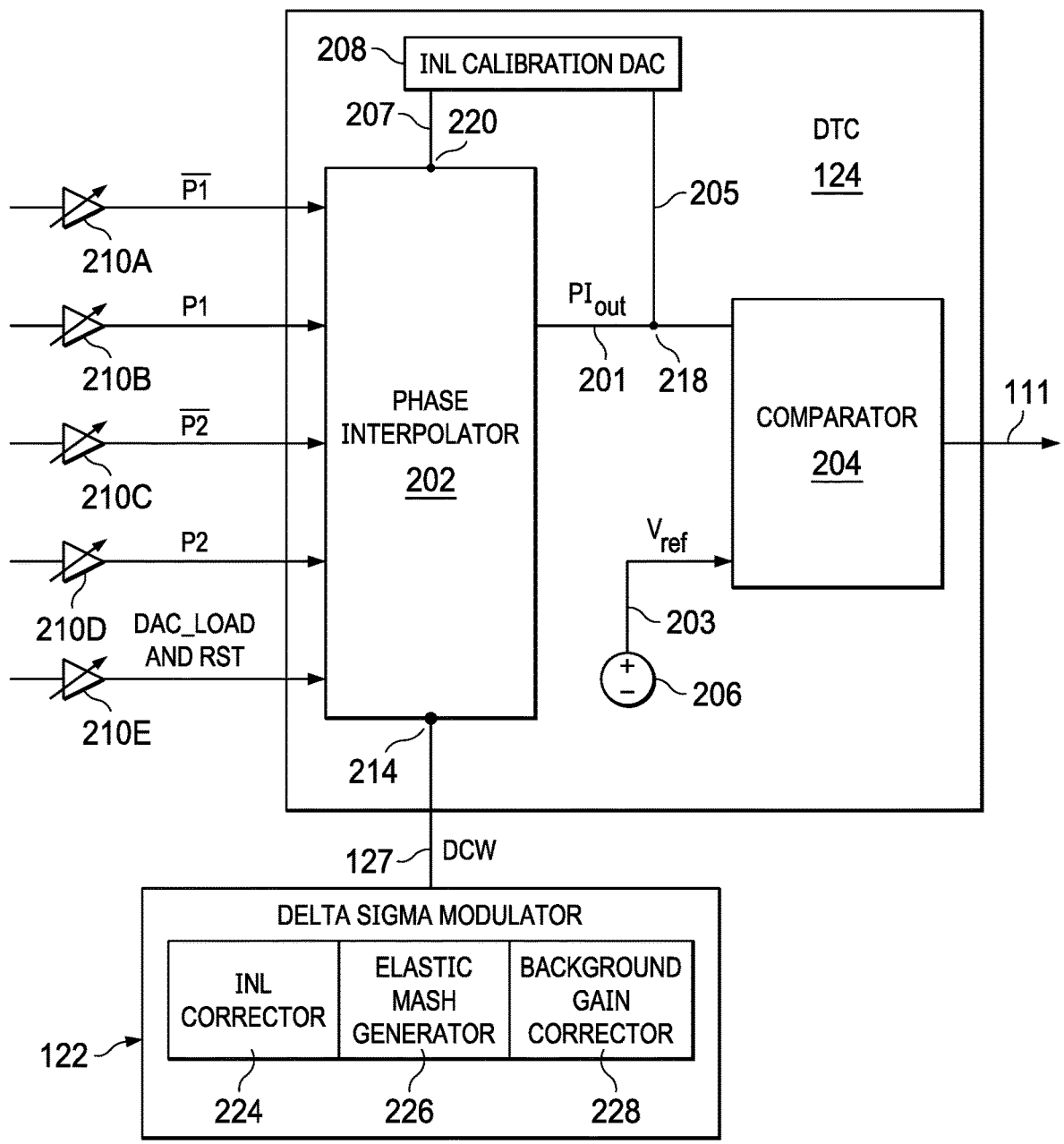
FIG. 2 is a block diagram of an example digital to time converter (DTC) of the oscillator system of FIG. 1 having circuitry that reduces nonlinearity and jitter to generate a precise amount of time delay.

FIG. 2 is a block diagram of the DSM 122 and the DTC 124 of FIG. 1 to generate a precise amount of time delay to modulate a time constant of an incoming signal. The example DTC 124 of FIG. 2 includes an example phase interpolator (PI) 202, an example comparator 204, an example voltage reference 206, and an example integral non-linearity (INL) calibration DAC 208. In FIG. 2, variable delay buffers 210A, 210B, 210C, 210D, and 210E are illustrated to input Nth clock signals $\overline{P1}$, P1, $\overline{P2}$, and P2 and DAC_LOAD & RST signal into the DTC 124 from the integer divider 120. In FIG. 2, an example INL corrector 224, an example elastic mash generator 226, and an example background gain corrector 228 are illustrated and implemented by the DSM 122 to improve the DCW 127 provided to the DTC 124.

In FIG. 2, a first variable delay buffer 210A is coupled to the phase interpolator 202 via the $\overline{P1}$ clock signal. The second variable delay buffer 210B is coupled to the phase interpolator 202 via the P1 clock signal. The third variable delay buffer 210C is coupled to the phase interpolator 202 via the $\overline{P2}$ clock signal. The fourth variable delay buffer 210D is coupled to the phase interpolator 202 via the P2 clock signal. The fifth variable delay buffer 210E is coupled to the phase interpolator 202 via the DAC_LOAD & RST signal. In some examples, the variable delay buffers 210A, 210B, 210C, 210D, and 210E are implemented by the integer divider 120 of FIG. 1. The example variable delay buffers 210A, 210B, 210C, 210D, and 210E may be a buffer amplifier, an operational amplifier, and/or any type of buffer circuitry that forwards the Nth clocks signals and the DAC_LOAD & RST signal to the phase interpolator 202.

In FIG. 2, the example phase interpolator 202 is coupled to the DSM 122 at a first node 214. The example phase interpolator 202 includes an output that is coupled to the comparator 204. The output includes a $PI_{out}$ voltage 201 that is generated by the phase interpolator 202. The phase interpolator 202 may be implemented by a digital to analog converter (DAC). In such an example, the DAC is a 12-bit DAC.

In FIG. 2, the example comparator 204 is coupled to the voltage reference 206 via the reference voltage $V_{ref}$ 203. The example comparator 204 includes an output that is coupled to the edge combining controller 110 of FIG. 1 and/or the MUX 112 of FIG. 1. The output of the comparator 204 includes the intermediate signal 111, which is provided to the edge combining controller 110 and/or the MUX 112 for further processing.

In FIG. 2, the example INL calibration DAC 208 is coupled to the output of the phase interpolator 202 at a second node 218 and to the phase interpolator 202 at a third node 220. The example INL calibration DAC 208 outputs a first calibration signal 205 and a second calibration signal 207. The first calibration signal 205 is output at the second node 218 and the second calibration signal 207 is output at the third node 220. In some examples, the INL calibration DAC 208 is implemented by a digital to analog converter having a lower output range (e.g., output voltage) than the phase interpolator 202, such that the output range of the INL calibration DAC 208 is enough to calibrate the INL. For example, the INL calibration DAC 208 may be implemented by an 8-bit DAC, a 6-bit DAC, a 4-bit DAC, etc.

The phase interpolator 202 is configured to interpolate between two edges of the input clock signal 101 as specified by the delay control word (DCW) 127. For example, if a divider ratio of 13.75 is specified, then digital control outputs 109 may instruct the integer divider 120 to count 13 edges (N=13) of input clock signal 101 and instruct the PI 202 to then interpolate 0.75 (DCW=0.75) of a period of input clock signal 101 before asserting intermediate signal 111. On the next output period, the digital control outputs 109 may instruct the integer divider 120 to count thirteen input periods and instruct the PI 202 to interpolate between half of a period of input clock signal 101. Intermediate signal 111 may then be combined with another intermediate signal 111 and divided by two in frequency by integer divider 114 to form the output clock signal 119 with a 50% duty cycle and with a period of twice, three times, etc., the number of 13.75 periods of input clock signal 101 or may just be divided by two in frequency by integer divider 114 to form the output clock signal 119 with a 50% duty cycle and with a period of 13.75 periods of input clock signal 101. This process is then repeated for each period of output clock signal 119. In some examples, each period will require a different amount of phase interpolation because the fractional frequency ratio causes the edge relations between the output clock signal 119 and the input clock signal 101 to continually change.

In this example, delay control word 127 is a 12-bit digital value (0-4095). In some examples, DCW 127 may have a higher or a lower resolution than 12-bits. The phase interpolator 202 generates a $PI_{out}$ voltage 201 that correlates to a requested phase shift amount indicated by the DCW 127. The $PI_{out}$ 201 may be compared to a reference voltage Vref 203 by the comparator 204. A transition on the output clock signal 119 is produced by comparator 204 when $PI_{out}$ 201 is equal to Vref, as will be described in further detail below.

As mentioned briefly above in connection with FIG. 1, the phase interpolator 202 and/or more generally, the DTC 124, produces a phase shift in response to the DCW 127 across a range of values (0-4095) in a highly linear manner. For purposes of this disclosure, "nonlinearity" may be described in a similar manner as commonly used for analog to digital convertors (ADC). To express the nonlinearity of an ADC in a standard way, manufacturers typically draw a line through the ADC transfer function, called the best fit line. The maximum deviation from this line is called "integral non-linearity" (INL), which can be expressed in percentage of the full scale or in LSBs (Least Significant Bit). INL is measured from the center of each step to that point on the line, where the center of the step would indicate an ideal ADC (e.g. manufactured in perfect conditions). The term "differential" refers to the values an ADC takes between two consecutive levels. In response to a changing input signal, the ADC samples the signal and the output of the ADC is a stream of binary numbers. An ideal ADC will step up or down one Least Significant Bit (LSB), without skipping any level and without holding the same decimal number past two or three LSBs. Differential nonlinearity (DNL) is defined as the maximum deviation from one LSB between two consecutive levels, over the entire transfer function.

For a digital to time converter, such as the DTC 124 of FIGS. 1 and 2, INL can be expressed relative to a best fit line of frequency output (e.g., intermediate signal 111) between a zero delay (0 bits) and a full scale delay (4095 bits). For example, INL can be determined by sampling the output of the DTC 124 from zero delay code to full scale delay code. In some examples, the DTC 124 experiences memory induced INL, which is caused when the DSM 122 outputs different values and/or digital patterns for the DCW 127. For example, the DTC 124 may become nonlinear when the phase interpolator 202 is instructed to interpolate one value (DCW=0.75) during a first period and a different value during a second period (e.g., DCW=0.5). When delay control words change, the DTC 124 becomes nonlinear due to slow settling nodes in the DTC 124 when the phase interpolator 202 meets full delay and resets to zero delay. The example DTC 124 implements circuitry, described in further detail below in connection with FIG. 3, to eliminate the slow settling nodes and, thus, reduce memory induced INL.

In FIG. 2, the example comparator 204 compares the $PI_{out}$ voltage 201 to a reference voltage Vref 203 generated by the example voltage reference 206. The example comparator 204 outputs the intermediate signal 111 that is proportional to the voltage of $PI_{out}$ 201 until the voltage of $PI_{out}$ 201 exceeds the reference voltage Vref 203. In some examples, the reference voltage Vref 203 is referred to herein as the "comparator threshold." The example comparator 204 utilizes the comparator threshold to set and reset the intermediate signal 111. In some examples, setting and resetting the intermediate signal 111 includes generating a rising edge and/or falling edge on the intermediate signal 111. The rising edges and falling edges correspond to the periods of the intermediate signal 111, which in turn corresponds to the frequency of the intermediate signal 111.

In some examples, memory induced INL is a result of ripple current at an LDO and/or a power supply of the digital to time converter. For example, the amount of current the comparator 204 draws varies with the delay control word 127 (lower DCW→lower delay→higher duration of comparator current) resulting in code dependent LDO ripple causing delay modulation of the comparator 204. The example DTC 124 includes separate LDOs (not shown)(e.g., custom LDOs described in further detail below in connection with FIG. 10) for the phase interpolator 202 and the comparator 204 to reduce the memory induced INL. However, to eliminate the memory induced INL, the comparator 204 implements a dynamic reset scheme. With this scheme, the comparator 204 generates a fixed duration ON pulse (e.g., high pulse) in response to the rise edge. Since the comparator 204 draws current from the LDO 106 only during this ON pulse, which is now of fixed width across all codes (e.g., all values of the DCW 127), the LDO 106 does not receive any code dependent current drawn from the comparator 204. Thus, the LDO 106 provides a similar and/or equal voltage pattern across all codes which in turn, eliminates the code dependent delay modulation and resultant code memory induced INL.

In FIG. 2, the example INL calibration DAC 208 is to fill in the missing code. In some examples, missing code is caused from mismatches in the phase interpolator 202 due to fabrication errors. In some examples, missing codes are detected during the INL estimation during factory calibration. When the missing codes are detected, the digital control circuitry 108 may adjust the code. However, in some examples, it is not practical to fill the missing steps of the codes digitally. Therefore, the example INL calibration DAC 208 is initialized to realize the dummy steps (e.g., code that should be included by the phase interpolator 202 but are not), which play the role of missing codes and correct non-linearity of the phase interpolator 202.

In FIG. 2, the example DSM 122 includes the example INL corrector 224 to correct the INL of the DTC 124. The example INL corrector 224 obtains INL values from memory (e.g., on-chip/off-chip memory) of the oscillator system 100. In this example, INL values are expressed relative to the best fit line of DTC delay output (e.g., intermediate signal 111) between a zero delay (0 bits) and a full scale delay (4095 bits). For example, an INL value may be a measurement of seconds corresponding to an amount of time that the intermediate signal 111 deviates from the best fit line. The example INL corrector 224 merges the DCW 127 with the INL values and generates a resultant code that is applied to the FOD 104. Such a resultant code corrects nonlinearity of generated by the DTC 124.

In FIG. 2, the variable delay buffers 210A, 210B, 210C, and 210D expand a timebase of the DTC 124 (e.g., generates a coarse gain adjustment of the DTC 124). Delay settings that cause the variable delay buffers 210A, 210B, 210C, and 210D to generate a coarse gain adjustment of the DTC 124 are stored in the digital control circuitry 108 (FIG. 1). This coarse gain adjustment ensures that a cumulative gain error from the DTC 124 remains net positive (e.g. DTC 124 produces more delay than required). To correct residual gain error with fine precision, the elastic mash generator 226 is used. In FIG. 2, the example DSM 122 includes the example elastic mash generator 226 to generate a sequence of numbers (e.g., the mash), indicative of the desired fractional divider value (control parameter N 125 and DCW 127), with a variable peak value. The mash is a sequence of numbers that start from zero or a first number and go to a peak number, then roll over and start again, controlled and/or determined by the digital control circuitry 108 and/or the frequency compensation sub-system 118 (FIG. 1). The elastic mash generator 226 advantageously changes and/or varies the peak value of the mash based on a gain error determined either during factory gain correction or by the background gain corrector 228. The gain of the FOD 104 can be erroneous when delay code is greater than a period of the input clock 101. For example, if the DSM 122 generates a control parameter N 125 and/or DCW 127 that is greater than the period of the input clock 101, the DTC 124 may erroneously delay the Nth clock signals and/or cause the output of the FOD 104 to be non-linear. The elastic mash generator 226 can adjust the peak number of the mash accordingly.

In FIG. 2, the example DSM 122 includes the background gain corrector 228 to determine and/or estimate the real time gain error during the operation of the FOD 104 and adjusts the elastic mash accordingly. The background gain corrector 228 is a hardware state machine which monitors the gain error of the FOD 104 during operation. In some examples, when the mash is greater than the period of the input clock 101, the background gain corrector 228 identifies error and notifies the elastic mash generator 226 to reduce the peak number of the mash.

Figure 3:
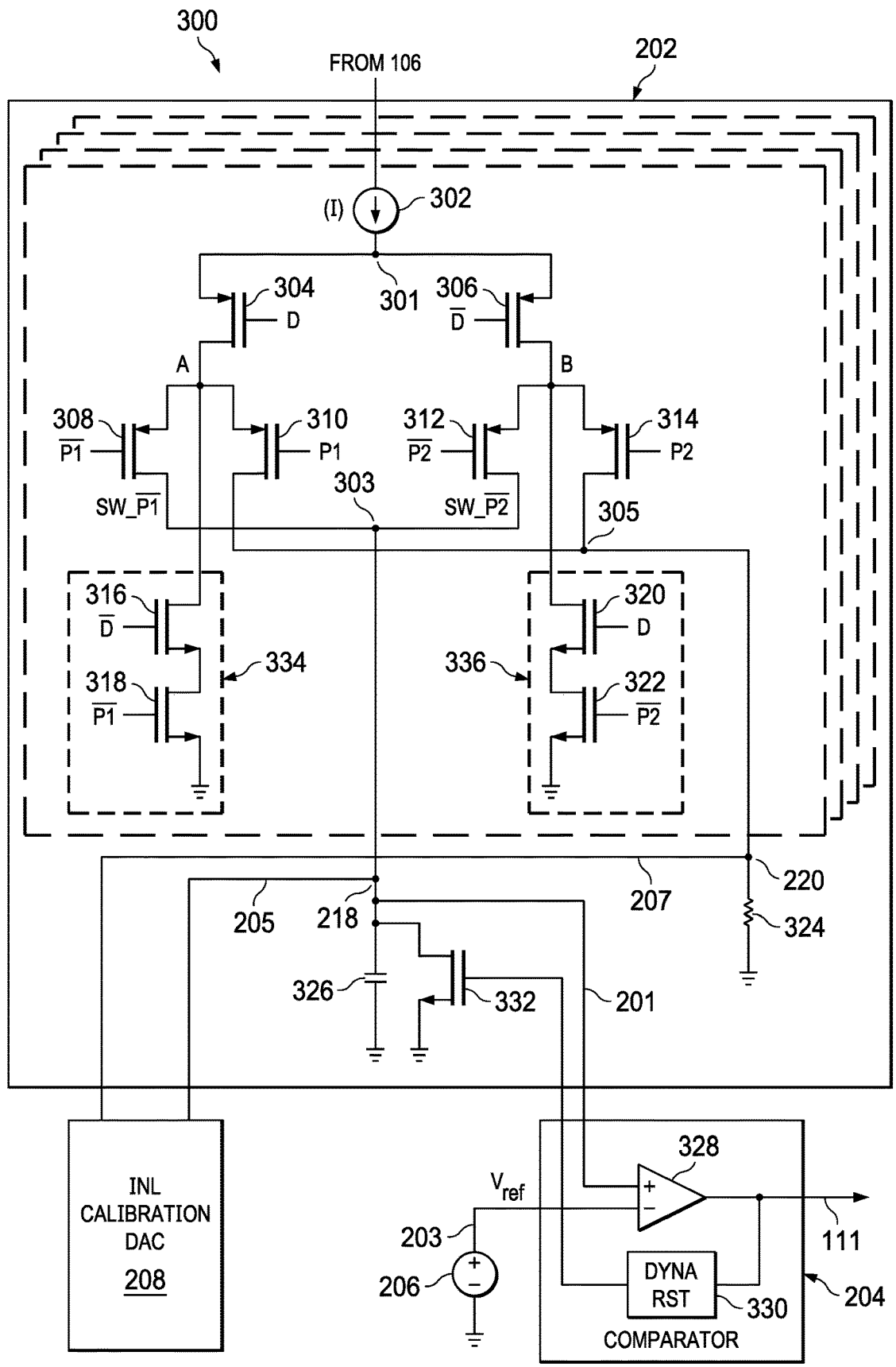
FIG. 3 is a schematic diagram of the example DTC of FIG. 1 to generate the precise amount of time delay with reduced nonlinearity and jitter.

FIG. 3 is a schematic diagram 300 of the phase interpolator 202 and the comparator 204 of the DTC 124 of FIGS. 1 and 2 to assert a time delay to modulate a time constant of an incoming signal. In this example, the schematic diagram 300 includes an example current source 302, an example first switch 304, an example second switch 306, an example third switch 308, an example fourth switch 310, an example fifth switch 312, an example sixth switch 314, an example seventh switch 316, an example eighth switch 318, an example ninth switch 320, and an example tenth switch 322 that make up the example phase interpolator 202. In this example, the schematic diagram 300 includes an example resistor 324, an example capacitor 326, an example comparator 328, example dynamic reset circuitry 330, and an example eleventh switch 332 to make up the example comparator 204.

In FIG. 3, the example first switch 304, the example second switch 306, the example third switch 308, the example fourth switch 310, the example fifth switch 312, and the example sixth switch 314 are P-channel metal-oxide-semiconductor field-effect transistors (pMOSFETs) (e.g., P-channel silicon MOSFETs, P-channel gallium nitride (GaN) MOSFETs, etc.). Alternatively, the example first switch 304, the example second switch 306, the example third switch 308, the example fourth switch 310, the example fifth switch 312, and the example sixth switch 314 may be implemented by N-channel metal-oxide-semiconductor field-effect transistors (nMOSFETs), bipolar junction transistors (BJTs), and/or any other type of transistor by reconfiguring the components of the phase interpolator 202 of FIGS. 2 and 3.

In FIG. 3, the example seventh switch 316, the example eighth switch 318, the example ninth switch 320, the example tenth switch 322, and the example eleventh switch 332 are nMOSFETs (e.g., N-channel silicon MOSFETs, N-channel gallium nitride (GaN) MOSFETs, etc.). Alternatively, the example seventh switch 316, the example eighth switch 318, the example ninth switch 320, the example tenth switch 322, and the example eleventh switch 332 may be implemented by pMOSFETs, bipolar junction transistors (BJTs), and/or any other type of transistor by reconfiguring the components of the phase interpolator 202 and/or comparator 204 of FIGS. 2 and 3.

In FIG. 3, the example current source 302 may be implemented using a DAC. In this example, DACs with a resolution of twelve bits may be used. In some examples, the DACs may use a higher or a lower resolution. The example current source 302 may be controlled by control circuitry, such as the DSM 122 of FIG. 1. For example, the current generated by the current source 302 may be determined and/or controlled by the DCW 127 generated by the DSM 122. The example current source 302 sources current from the LDO 106.

The example phase interpolator 202 includes the current source 302 which is coupled to the first switch 304 and the second switch 306 at a seventh node 301. The first switch 304 includes a first source terminal, a first gate terminal, and a first drain terminal. The second switch 306 includes a second source terminal, a second gate terminal, and a second drain terminal. The first source terminal is coupled to the second source terminal at the seventh node 301. The first gate terminal and the second gate terminal are configured to be coupled to the DSM 122 to receive a control signal (D) and an inverted control signal ($\overline{D}$). In this example, D corresponds to a processed (e.g., transformed) DCW 127. For example, the DTC 124 may include DAC logic circuitry to transform delay control words (e.g., DCW 127) into a format that is readable by the phase interpolator 202. For example, the first switch 304 and second switch 306 may not be able to be controlled (e.g., turn on and off) with a 12-bit word and, thus, would not provide the adequate current used to perform phase interpolation. Therefore, DAC logic circuitry may be included to process the DCW into delay code, and queue the delay code for use by the phase interpolators 202. In this example, ($\overline{D}$) corresponds to the inverse of the processed (e.g., transformed) DCW 127. In some examples, the first and second source terminals may be emitter terminals, collector terminals, current terminals, and/or terminals. In some examples, the first and second gate terminals may be base terminals, current terminals, control terminals, and/or terminals. The first and second drain terminals may be emitter terminals, collector terminals, current terminals, and/or terminals.

The example phase interpolator 202 includes the third switch 308 and the fourth switch 310 which are coupled to the first switch 304 at node A. The third switch 308 includes a third source terminal, a third gate terminal, and a third drain terminal. The fourth switch 310 includes a fourth source terminal, a fourth gate terminal, and a fourth drain terminal. The third source terminal is coupled to the fourth source terminal at node A. The third gate terminal is to receive the first Nth clock signal $\overline{P1}$ (e.g., an inverted divided clock signal $\overline{P1}$) from the first variable delay buffer 210A. The fourth gate terminal is to receive the second Nth clock signal P1 (e.g., divided clock signal P1) from the second variable delay buffer 210B. In some examples, the third and fourth source terminals may be emitter terminals, collector terminals, current terminals, and/or terminals. In some examples, the third and fourth gate terminals may be base terminals, current terminals, control terminals, and/or terminals. The third and fourth drain terminals may be emitter terminals, collector terminals, current terminals, and/or terminals.

The example phase interpolator 202 includes the fifth switch 312 and the sixth switch 314 which are coupled to the second switch 306 at node B. The fifth switch 312 includes a fifth source terminal, a fifth gate terminal, and a fifth drain terminal. The sixth switch 314 includes a sixth source terminal, a sixth gate terminal, and a sixth drain terminal. The fifth source terminal is coupled to the sixth source terminal at node B. The fifth gate terminal is to receive the third Nth clock signal $\overline{P2}$ (e.g., an inverted divided clock signal $\overline{P2}$) from the third variable delay buffer 210C. The sixth gate terminal is to receive the fourth Nth clock signal P2 (e.g., divided clock signal P2) from the fourth variable delay buffer 210D. The fifth drain terminal of the fifth switch 312 is coupled to the third drain terminal of the third switch 308 at an eighth node 303. The sixth drain terminal of the sixth switch 314 is coupled to the fourth drain terminal of the fourth switch 310 at a ninth node 305. In some examples, the fifth and sixth source terminals may be emitter terminals, collector terminals, current terminals, and/or terminals. In some examples, the fifth and sixth gate terminals may be base terminals, current terminals, control terminals, and/or terminals. The fifth and sixth drain terminals may be emitter terminals, collector terminals, current terminals, and/or terminals.

The example phase interpolator 202 includes the seventh switch 316 which is coupled to the first switch 304 at node A. The seventh switch 316 includes a seventh source terminal, a seventh gate terminal, and a seventh drain terminal. The seventh drain terminal is coupled to the first drain terminal at node A. The seventh gate terminal is configured to be coupled to the DSM 122 to receive $\overline{D}$ signal. The phase interpolator 202 includes the eighth switch 318 which is coupled to the seventh switch 316. The eighth switch 318 includes an eighth source terminal, an eighth gate, and an eighth drain terminal. The eighth drain terminal is coupled to the seventh source terminal of the seventh switch 316. The eighth gate terminal is to receive the second Nth clock signal $\overline{P1}$ from the second variable delay buffer 210B. The seventh switch 316 and the eighth switch 318 make up a first low current detector 334. In some examples, the seventh and eighth source terminals may be emitter terminals, collector terminals, current terminals, and/or terminals. In some examples, the seventh and eighth gate terminals may be base terminals, current terminals, control terminals, and/or terminals. The seventh and eighth drain terminals may be emitter terminals, collector terminals, current terminals, and/or terminals.

The example phase interpolator 202 includes the ninth switch 320 which is coupled to the second switch 306 at node B. The ninth switch 320 includes a ninth source terminal, a ninth gate terminal, and a ninth drain terminal. The ninth drain terminal is coupled to the second drain terminal at node B. The ninth gate terminal is configured to be coupled to the DSM 122 to receive D signal. The phase interpolator 202 includes the tenth switch 322 which is coupled to the ninth switch 320. The tenth switch 322 includes a tenth source terminal, a tenth gate, and a tenth drain terminal. The tenth drain terminal is coupled to the ninth source terminal of the ninth switch 320. The tenth gate terminal is to receive the fourth Nth clock signal P2 from the fourth variable delay buffer 210D. The ninth switch 320 and the tenth switch 322 make up a second low current detector 336. In some examples, the ninth and tenth source terminals may be emitter terminals, collector terminals, current terminals, and/or terminals. In some examples, the ninth and tenth gate terminals may be base terminals, current terminals, control terminals, and/or terminals. The ninth and tenth drain terminals may be emitter terminals, collector terminals, current terminals, and/or terminals.

The phase interpolator 202 includes a resistor 324 which is coupled to the fourth switch 310 and the sixth switch 314 at the ninth node 305. The INL calibration DAC 208 is coupled to the resistor 324 at the third node 220, which has the same potential as the ninth node 305.

The phase interpolator 202 includes the capacitor 326 which is coupled to the third switch 308 and the fifth switch 312 at the eighth node 303. The INL calibration DAC 208 is coupled to the capacitor at the second node 218, which has the same potential as the eighth node 303.

The comparator 204 includes the comparator 328 which is coupled to the capacitor 326. The comparator 328 includes a supply input, a non-inverting input, an inverting input, and an output. The supply input (not shown) is configured to be coupled to the LDO 106 of FIG. 1 to receive a custom supply voltage. The non-inverting input of the comparator 328 is coupled to the capacitor 326 and receives the $PI_{out}$ voltage 201. The inverting input of the comparator 328 is coupled to the voltage reference 206 and receives the voltage Vref 203. The comparator 328 may be any type of amplifier that is used to generate an output based on a comparison of voltages and/or current. The output of the comparator 328 is the intermediate signal 111.

The comparator 204 includes the dynamic reset circuitry 330 which is coupled to the output of the comparator 328, such that the dynamic reset circuitry 330 is a feedback portion of the comparator 204. The dynamic reset circuitry 330 is described in further detail below in connection with FIG. 6.

The phase interpolator 202 includes the eleventh switch 332 which is coupled to the capacitor 326 and to the dynamic reset circuitry 330. The eleventh switch 332 includes an eleventh source terminal, an eleventh gate terminal, and an eleventh drain terminal. The eleventh drain terminal is coupled to the capacitor 326. The eleventh gate terminal is coupled to the dynamic reset circuitry 330. In some examples, the eleventh source terminal may be an emitter terminal, a collector terminal, a current terminal, and/or a terminal. In some examples, the eleventh gate terminal may be a base terminal, a current terminal, a control terminal, and/or a terminal. In some examples, the eleventh drain terminal may be an emitter terminal, a collector terminal, a current terminal, and/or a terminal.

The phase interpolator 202 comprises a number of legs. Each leg of the phase interpolator 202 includes and/or comprises the circuitry (e.g., the switches 304, 306, 308, 310, 312, 314, 316, 318, 320, 322) included in the schematic diagram of the phase interpolator 202 FIG. 3. The legs of the phase interpolator 202 all connect at a common point. The common point of the phase interpolator 202 is the capacitor 326. The legs of the phase interpolator 202 additionally connect at the resistor 324 and the eleventh switch 332. As such, the resistor 324, the capacitor 326, and the eleventh switch 332 are not included in the legs of the phase interpolator 202 and, thus, are common to the legs of the phase interpolator 202.

In an example operation of the DTC 124 of FIG. 3, the DSM 122 of FIG. 1 provides the DCW 127 parameter. In some examples, the DTC 124 may load and process (e.g., transform) the DCW 127 parameter into a value (e.g., an analog value, a voltage, etc.) that is readable by the phase interpolator 202. In this example, the transformed DCW 127 parameter is a value between a range of 0.0 to 1.0 that represents a percentage of a time period to shift the phase of output clock signal 119 with respect to input clock signal 101.

During an interpolation cycle, the current source 302 provides a current, via the first switch 304 and the second switch 306, that is proportional to the DCW 127 parameter. During a first time period, the DSM 122 provides a DCW 127 that is transformed into a voltage (D) signal, that may turn on or off the first switch 304 and second switch 306. In this manner, the DCW 127 signal changes the magnitude of current flowing to the capacitor 326 during the first time period. During the first time period, the current from the current source 302 is provided to ramp the capacitor 326 via the third switch 308 while the sixth switch 314 dissipates the current from current source 302. The third switch 308 is on and charging the capacitor 326 when the first Nth clock signal $\overline{P1}$ is low (e.g., logic zero) and the second Nth clock signal P1 is high. The current from current source 302 charges ramp capacitor 326 and produces a $PI_{out}$ voltage 201 that ramps up with a slope that is proportional to DCW 127 during the first period of time to produce $PI_{out}$ voltage 201 that is proportional to the requested phase shift.

During a second period of time, the full current of the current source 302 is provided to ramp capacitor 326 via the third switch 308 or the fifth switch 312. At the second period of time, the fifth switch 312 is initiated due to the rising edge of the fourth Nth clock signal P2, and, thus, the falling edge of the third Nth clock signal $\overline{P2}$. Thus, during the second period of time, a constant rate of charge is produced that is independent of the DCW 127 parameter. Thus, $PI_{out}$ voltage 201 ramps up with a slope that is independent of the DCW 127 parameter during the second period of time and is offset by the $PI_{out}$ voltage 201 that is proportional to the DCW 127. In this manner, a two-step voltage ramp signal is produced in which the first step produces a voltage magnitude proportional to a requested phase shift and in which the second step allows an output signal that has the requested phase shift to be produced based on the voltage magnitude.

During the first period of time and the second period of time, the voltage reference 206 provides reference voltage Vref 203 to the comparator 328 for comparison to the PI$_{out}$ voltage 201. During a constant slope phase and/or the second period of time (e.g., the constant rate of charge initiated by the third and fourth Nth clock signals $\overline{P2}$ and P2), when the PI$_{out}$ voltage 201 crosses and/or meets the reference voltage Vref 203 (e.g., comparator threshold), the comparator 328 generates a first rising edge of the intermediate signal 111. The comparator 328 generates intermediate signal 111 having a phase shift relative to input clock signal 101 that is linear with respect to DCW 127 parameter. For example, when a transformed DCW=0, intermediate signal 111 is asserted at the first rising edge (e.g., when PI$_{out}$ voltage 201 meets the comparison threshold), which has a phase shift of 0 degrees relative to input clock signal 101. When a transformed DCW=0.5, the intermediate signal 111 is asserted at the first rising edge, which has a phase shift of 180 degrees relative to input clock signal 101. When a transformed DCW=1.0, the intermediate signal 111 is asserted at the first rising edge, which has a phase shift of 360 degrees relative to input clock signal 101. Thus, any phase shift amount between 0-360 degrees may be produced by a corresponding selection of DCW 127.

During the constant slope phase and/or second period of time, the dynamic reset circuitry 330 detects the rising edge of the intermediate signal 111 and resets the capacitor 326 to prepare it for the next phase and/or next interpolation cycle. In this example, the dynamic reset circuitry 330 is configured to wait for a fixed period of time from the first detection of the rising edge to reset the capacitor 326. In some examples, the dynamic reset circuitry 330 resets the capacitor 326 by initiating the eleventh switch 332, which when turned on, discharges the capacitor 326. The example dynamic reset circuitry 330 is described in further detail below in connection with FIG. 6.

Before the interpolation cycle, the first and second current detectors 334 and 336 are to dissipate and/or otherwise, discharge, the floating current at nodes A and B to prevent a long settling of current at nodes A and B. The first and second low current detectors 334 and 336 monitor for low and/or zero current through nodes A and/or B based on determining when a state of the first switch 304 and/or second switch 306 transitions from an on state to an off state. In this example, the first low current detector 334 identifies when the first switch 304 is turned off based on the D signal (e.g., the transformed DCW 127 signal), because the D signal controls the on and off switching of the first switch 304. In this example, the second low current detector 336 identifies when the second switch 306 is turned off based on the $\overline{D}$ signal (e.g., the inverse of the transformed DCW 127 signal), because the $\overline{D}$ signal controls the on and off switching of the second switch 306. In some examples, when the D signal is low (e.g., logic low), the seventh gate terminal of the seventh switch 316 obtains a high signal (e.g., a logic high). In this manner, the moment the D signal goes low, the seventh and eighth switches 316 and 318 turn on in a timed manner, which causes the current through node A to go low because the seventh and eighth switches 316 and 318 pull the current down to ground. In some examples, when the $\overline{D}$ signal is low (e.g., logic low), the ninth gate terminal of the ninth switch 320 obtains a high signal (e.g., a logic high). In this manner, the moment the $\overline{D}$ signal goes low, the ninth and tenth switches 320 and 322 turn on in a timed manner, which causes the current through node B to go low because the ninth and tenth switches 320 and 322 pull the current down to ground. In some examples, floating currents at nodes A and/or B can cause the delay modulation (e.g., the output of rising and falling edges on the intermediate signal 111) to be dependent on the DCW 127, which in turn gives rise to memory induced INL. Therefore, the first and second current detectors 334 and 336 eliminate memory induced INL by keeping track of all nodes in the DTC 124 that are slow settling and discharges them so that no nodes are building the slow memory.

In some examples, the phase interpolator 202 implements a split commutation switch array by replicating first switch 304, the second switch 306, the third switch 308, the fourth switch 310, the fifth switch 312, the sixth switch 314, the seventh switch 316, the eighth switch 318, the ninth switch 320, and the tenth switch 322 for each leg of the phase interpolator. The commutation switch array enables the split commutation switch approach at the DTC 124 by repeating the phase interpolation operation using the number of legs of the phase interpolator 202. For example, the DTC 124 may implement a 12-bit DAC based phase interpolator for interpolating between edges of the Nth clock signals based on a number of bits included in the DCW 127 (e.g., for 12 bits in a 12-bit word, eight bits in an 8-bit word, etc.). For example, if the DSM 122 outputs a 12 bit word, each of the 12 legs of the 12-bit phase interpolator 202 obtains one of the 12 bits (e.g., each first switch 304 and second switch 306 obtain one control transformed bit, delay code, etc., and provide appropriate current to charge the capacitor 326). The split commutation switch approach reduces systematic INL due to the first switch 304 and second switch 306 having single binary states during an interpolation cycle, compared to 12-bit DAC based phase interpolators which had up 4095 different states and, thus, prone to higher INL.

Figure 4:
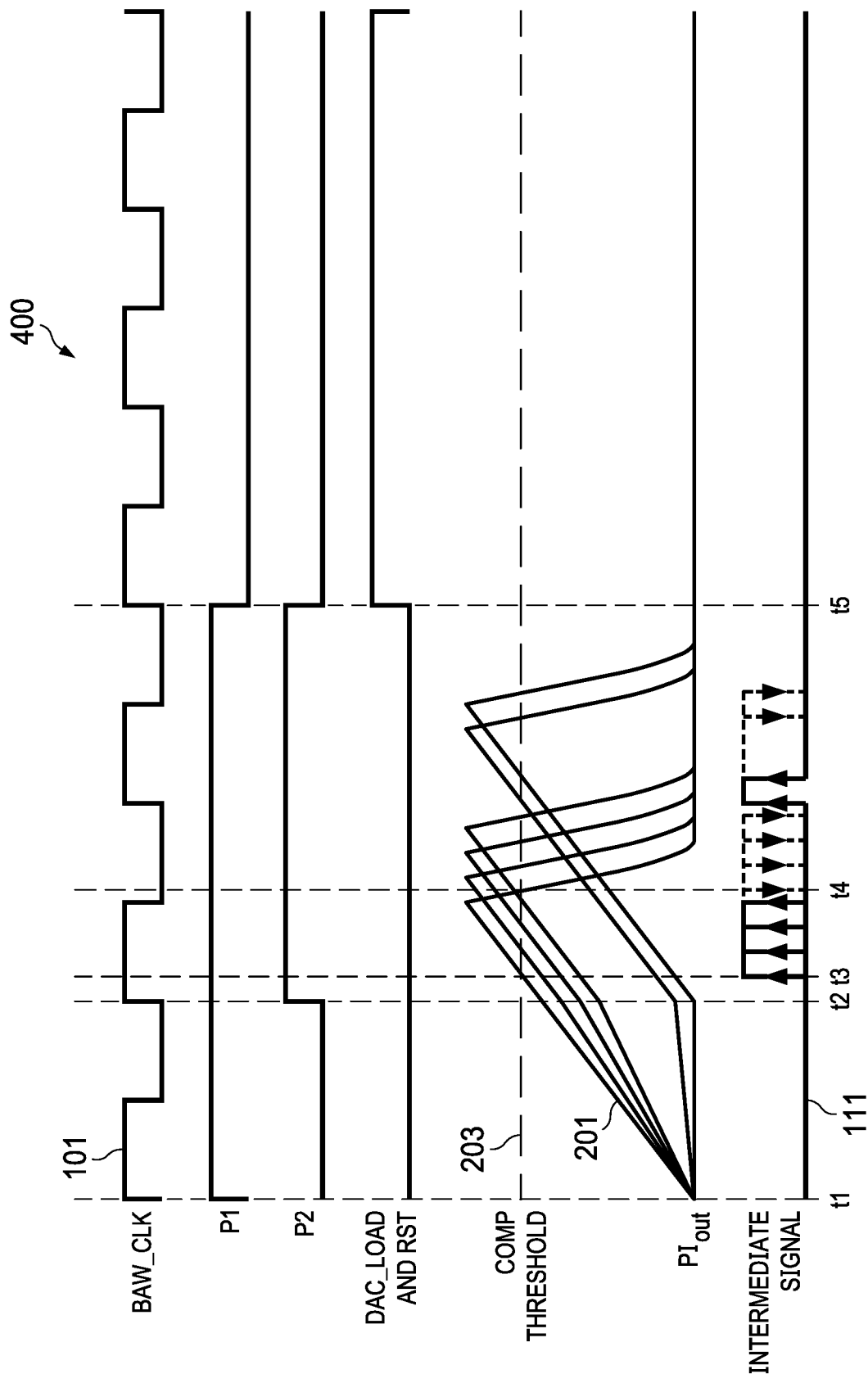
FIG. 4 is a first timing diagram illustrating signals through the DTC of FIGS. 2 and 3 during operation.

FIG. 4 is a timing diagram 400 illustrating the signals through the DTC 124 during operation. The timing diagram 400 includes the input clock signal 101, the second Nth clock signal P1, the fourth Nth clock signal P2, the DAC_LOAD & RST signal, the voltage Vref 203, the PI$_{out}$ 201 voltage, and the intermediate signal 111.

At a first time t1 (start of the first time phase), the integer divider 120 outputs a rising edge for the second Nth clock signal P1 to initiate a first phase (e.g., the variable slope phase) of the DTC 124. During the first phase, the current from the current source 302 is provided to ramp the capacitor 326 via the third switch 308, turned on due to the rising edge of the second Nth clock signal P1. At time t1, the current source 302 charges capacitor 326 with current that is proportional to the DCW 127 parameter to generate PI$_{out}$ voltage 201, where the PI$_{out}$ voltage 201 has a slope proportional to the DCW 127 and, thus, a slope that is proportional to the requested phase shift (e.g., requested via the digital control outputs 109). During the first phase, the fourth Nth clock signal P2 is inactive.

At a second time t2 (start of the second time phase), the integer divider 120 outputs a rising edge for the fourth Nth clock signal P2 to initiate a second phase (e.g., the constant slope phase) of the DTC 124. During the second phase, the full current of the current source 302 is provided to ramp the capacitor 326 via the third switch 308 or the fifth switch 312, depending on whether the first switch 304 is on or the second switch 306 is on. The fifth switch 312 is initiated (e.g., turned on) at time t2 responsive to the rising edge of the fourth Nth clock signal P2. During the second phase, the capacitor 326 is charged at a constant rate, independent of the DCW 127 and proportional to the constant supply of full current from the current source 302 via the fifth switch 312. The PI$_{out}$ voltage 201 ramps up with a slope that is offset from the slope generated during the first phase. In this manner, a two-step voltage ramp signal is produced in which the first step produces a voltage magnitude proportional to a requested phase shift and in which the second step allows an output signal that has the requested phase shift to be produced based on the voltage magnitude.

At a third time t3, the $PI_{out}$ voltage 201 meets and/or crosses Vref 203 (e.g., the comparator threshold). The comparator 328 outputs a rising edge on the intermediate signal 111 responsive to $PI_{out}$ voltage 201 meeting the comparator threshold voltage. In this example, the comparator 328 modulates the output of the intermediate signal 111 based on the multiple voltage slopes of $PI_{out}$ 201 meeting the comparator threshold.

At time t3, the dynamic reset circuitry 330 detects the first rising edge of the intermediate signal 111 and waits for a fixed period of time to reset the charge on the capacitor 326. For example, the dynamic reset circuitry 330 waits from time t3 to time t4 to reset the charge on the capacitor 326. At time t4, the capacitor 326 is discharged via the eleventh switch 332 and the $PI_{out}$ voltage 201 decreases below Vref 203. In this example, the comparator 328 outputs a falling edge on the intermediate signal 111 responsive to $PI_{out}$ voltage 201 dropping below Vref 203. In some examples, the comparator 328 modulates the falling edge of the intermediate clock signals 111 based on the multiple voltage slopes of $PI_{out}$ 201 dropping below the comparator threshold.

At time t5, the integer divider 120 outputs the DAC_LOAD & RST signal to notify the DTC 124 to load a new DCW 127. In some examples, the DCW 127 does not change between interpolation cycles, but still needs to be loaded by the DTC 124 for a new interpolation cycle. At time t5, the DTC 124 is ready for another interpolation cycle. For example, the capacitor 326 is fully discharged and the Nth clock signals P1 and P2 are inactive.

Figure 5:
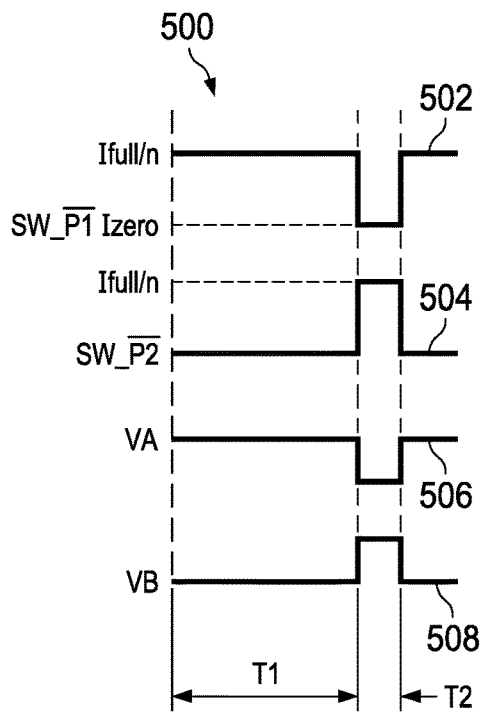
FIG. 5 is a second timing diagram illustrating the response of voltages at two different nodes in the DTC of FIGS. 2 and 3.

FIG. 5 is a timing diagram 500 depicts the response of the voltage at nodes A and B when the low current detectors 334 and 336 are initiated. The timing diagram 500 includes a first current 502, a second current 504, a first voltage 506, and a second voltage 508. The first current 502 corresponds to the current through the third switch 308 when the first switch 304 turns on and off. The second current 504 corresponds to the current through the fifth switch 312 when the second switch 306 turns on and off. The first voltage (VA) 506 corresponds to the voltage at node A when the first switch 304 turns on and off. The second voltage (VB) corresponds to the voltage at node B when the second switch 306 turns on and off.

In FIG. 5, during a time T1, the first switch 304 is providing full current to the third switch 308, as depicted by the high first current 502. Time T1 corresponds to a period of time when delay code is a logic one. The current provided by the first switch 304 causes the first voltage VA 506 to be high. During the time T1, all the current is flowing through the first switch 304 and, thus, no current is flowing through the second switch 306 to the fifth switch 312, as depicted by the low second current 504. The lack of current provided by the second switch 306 would have caused the voltage at node B to retain past the value from previous code (e.g., a previous delay code), which would have caused memory induced INL due to a dumping of previous charge on the capacitor 326. Advantageously, the second low current detector 336 detects a "zero current situation" (e.g., the lack of current provided by the second switch 306) and discharges the charge at node B to a defined state, which in this example is zero volts.

In FIG. 5, during a time T2, the second switch 306 is providing full current to the fifth switch 312. The current provided by the second switch 306 causes the second voltage VB 508 to be high. During the time T2, all the current is flowing through the second switch 306 and, thus, no current is flowing through the first switch 304 to the third switch 308, as depicted by the low first current 502. The lack of current provided by the first switch 304 would have caused the voltage at node A to retain past the value from previous code (e.g., a previous delay code), which would have caused memory induced INL due to dumping of previous charge on the capacitor 326. Advantageously, the first low current detector 334 detects a "zero current situation" (e.g., the lack of current provided by the first switch 304) and discharges the charge at node A to a defined state, which in this example is zero volts.

In this example, the voltages at nodes A and B are never left undefined. For example, the first low current detector 334 and the second low current detector 336 ensure that the potentials at nodes A and B are always at a defined state. In this manner, the first low current detector 334 and the second low current detector 336 eliminate memory induced INL.

Figure 6:
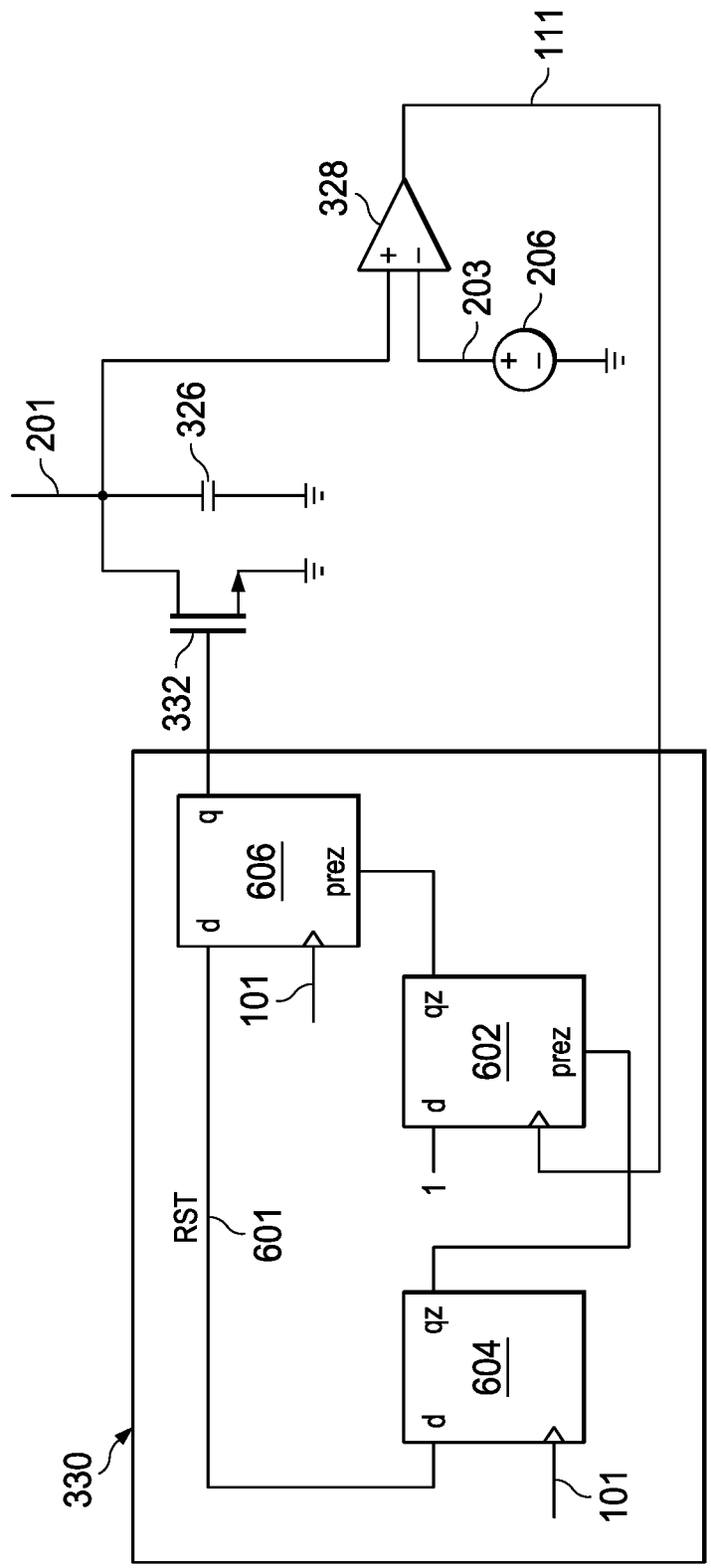
FIG. 6 is a schematic diagram of an example dynamic reset circuitry of the DTC of FIGS. 2 and 3 to generate a reset signal that generates a falling edge of the timing signal.

FIG. 6 is a schematic diagram of the dynamic reset circuitry 330 of FIG. 3 to generate a reset signal 601 to reset the charge of the capacitor 326 of FIG. 3. The dynamic reset circuitry 330 includes an example first latch 602, an example second latch 604, and an example third latch 606. In this example, the first latch 602, the second latch 604, and the third latch 606 are implemented by D-type flip-flops. Additionally and/or alternatively, the first latch 602, the second latch 604, and the third latch 606 may be implemented by set/reset (SR) latches, JK-type flip-flops, T-type flip-flops, and/or any type of basic latch and/or flip-flop.

The first latch 602 includes a clock input, a data input, an asynchronous preset input (PREZ), and an output (qz), the second latch 604 includes a clock input, a data input, and an output (qz), and the third latch 606 includes a clock input, a data input, an asynchronous preset input (PREZ), and an output (q). The clock input of the first latch 602 is coupled to the output of the comparator 328, the data input of the first latch 602 is configured to receive a logic one (e.g. a logic "1", a logical high signal), and the PREZ input of the first latch 602 is coupled to the output (qz) of the second latch 604. The clock input of the second latch 604 is configured to obtain the input clock signal 101 and the data input of the second latch 604 is coupled to the data input of the third latch 606. The data pin input of the second latch 604 and the data input of the third latch 606 obtain the reset signal 601. In this example, the reset signal 601 is generated by the integer divider 120 and provided by the example fifth variable delay buffer 210E via the DAC_LOAD & RST signal. The clock input of the third latch 606 is configured to obtain the input clock signal 101 from the oscillator 102. The PREZ input of the third latch 606 is coupled to the output (qz) of the first latch 602, and the output of the third latch 606 (q) is coupled to the eleventh gate terminal of the eleventh switch 332.

In an example operation of the dynamic reset circuitry 330, the comparator 328 outputs a rising edge at the intermediate signal 111. The clock input of the first latch 602 obtains the high signal of the rising edge and the output pin of the first latch 602 latches a logic zero (e.g. a logic "0", a logical low signal) at the data input. The PREZ input of the third latch 606 receives the logic zero and activates the output (q) of the third latch 606 to go high, because the logic zero will be inverted to logic high and preset the output (q) of the third latch to be high. The logic high at the output (q) of the third latch 606 initiates the resetting of the capacitor 326.

In some examples, the output of the comparator 328 does not toggle at all. In such an example, the first latch 602 does not detect when the charge on the capacitor 326 meets the threshold set by the voltage reference 206 and, thus, does not initiate the output (q) of third latch 606. The integer divider 120 provides the DAC_LOAD & RST signal to compensate for such an example (e.g., to compensate for the mis-toggling at the comparator output).

In an example operation of the dynamic reset circuitry 330 when the comparator 328 does not toggle, the integer divider 120 provides a logic high at the reset signal 601. The high reset signal 601 forces the second latch 604 to output a logic low. The PREZ input of the first latch 602 obtains the logic low from the output (qz) of the second latch 604 and inverts the logic low to activate the (qz) output of the first latch 602. The first latch 602 inverts and latches the signal on the data input (e.g., inverts the logic one to logic zero) responsive to the activation from the PREZ input. The PREZ input of the third latch 606 receives the logic zero and activates the output (q) of the third latch 606 to go high, because the logic zero will be inverted to logic high and preset the output (q) of the third latch to be high. The logic high at the output (q) of the third latch 606 initiates the resetting of the capacitor 326.

Figure 7:
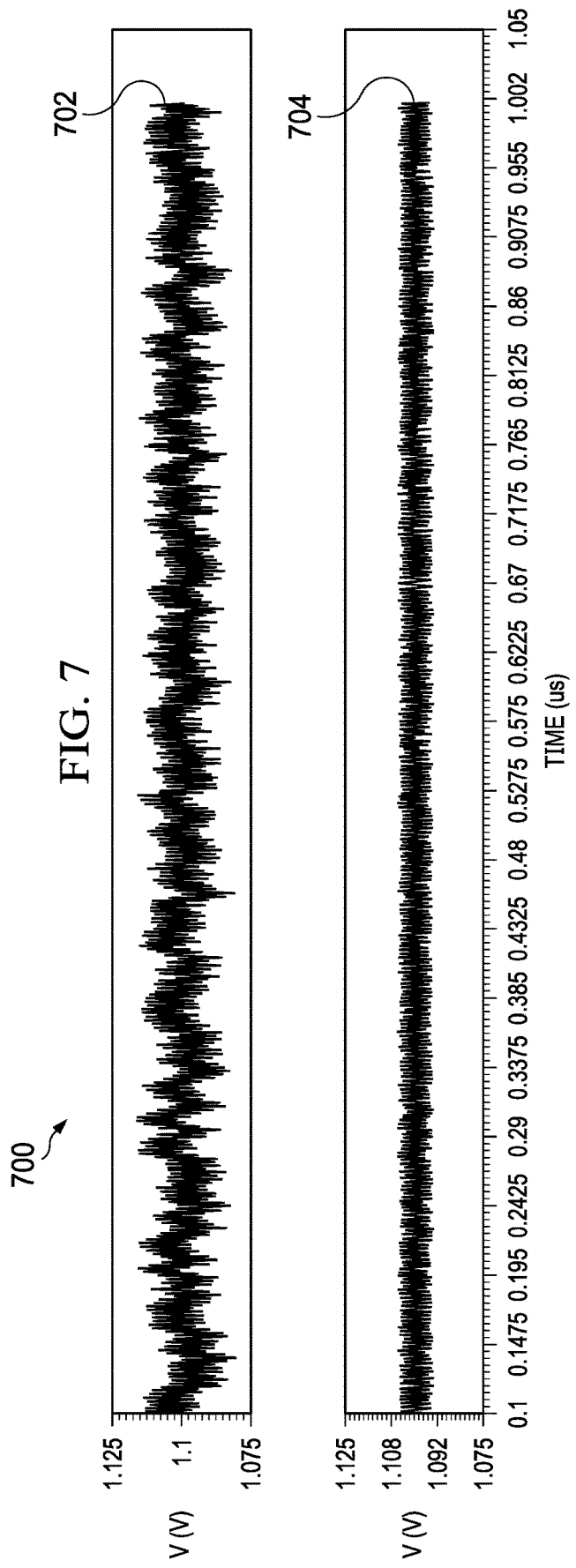
FIG. 7 is a signal plot (where voltage is plotted on the y-axis and time is plotted on the x-axis) illustrating an improvement of an example comparator low dropout regulator of the DTC of FIGS. 2 and 3 relative to a prior comparator low dropout regulator.

FIG. 7 is a signal plot 700 illustrating an improvement of the low dropout regulator 106 of FIG. 1 relative to a prior low dropout regulator supplying power to an FOD. The signal plot 700 includes a first LDO output signal 702 and a second LDO output signal 704.

In FIG. 7, the first LDO output signal 702 corresponds to an LDO supplying voltage to a comparator that does not include the dynamic reset circuitry 330 of FIGS. 3 and 6. The first LDO output signal 702 varies with the delay control word 127. For example, the amount of comparator current drawn by the comparator varies with the delay control word (e.g., the lower DCW→lower delay→higher duration of comparator current) resulting in DCW dependent ripple of the first LDO output signal 702, causing delay modulation of comparator.

The second LDO output signal 704 corresponds to the output of the LDO 106 supplying voltage to the FOD 104. The second LDO output signal 704 does not vary with the delay control word 127 because the amount of comparator current drawn by the LDO 106 is fixed. The comparator current drawn by the LDO 106 is fixed due to the dynamic reset circuitry 330, which resets the $PI_{out}$ voltage 201 and, thus, the intermediate signal 111, at a fixed period of time after a rising edge of the intermediate signal is asserted. The second LDO output signal 704 is therefore independent of the DCW 127 and does not cause delay modulation of the comparator 204.

Figure 8:
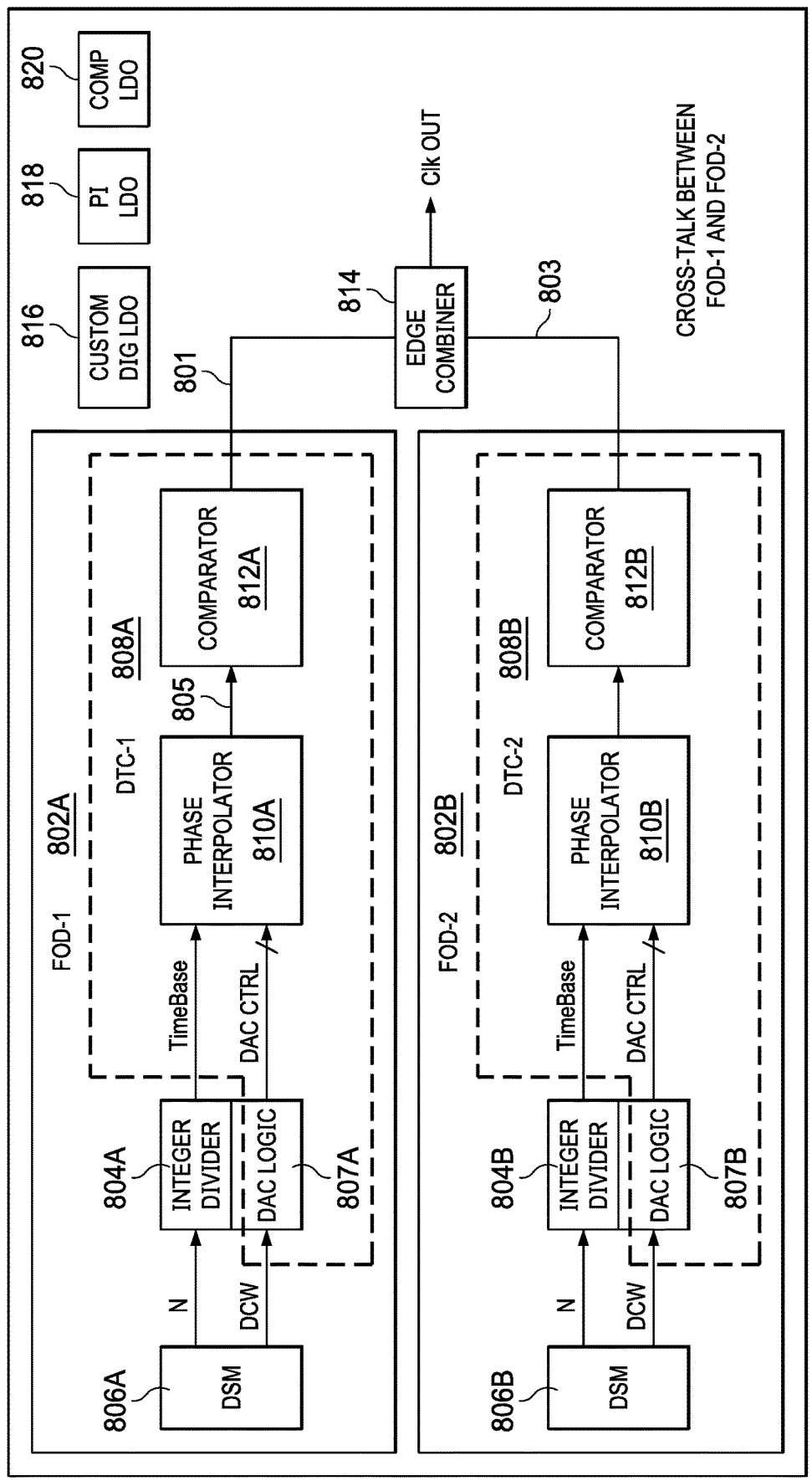
FIG. 8 is a block diagram of a first fractional output divider (FOD) and a second FOD generating cross talk while operating in parallel to generate timing signals.

FIG. 8 is an example block diagram of a first FOD-1 802A and a second FOD-2 802B operating in parallel to divide an input oscillating signal down to desired timing signals 801 and 803. The first FOD-1 802A includes an integer divider 804A, a delta sigma modulator 806A, and a DTC-1 808A. The DTC-1 808A includes a phase interpolator 810A, a comparator 812A, and DAC logic circuitry 807A. The second FOD-2 802B includes an integer divider 804B, a delta sigma modulator 806B, and a DTC-2 808B. The DTC-2 808B includes a phase interpolator 810B, a comparator 812B, and DAC logic circuitry 807B.

In FIG. 8, the DAC logic circuitry 807A, 807B transforms delay control words into a format that is readable by the phase interpolators 810A, 810B. For example, the phase interpolators 810A, 810B may not be able to read the delay control word and, thus, would not be able to perform phase interpolation. Therefore, the DAC logic circuitry 807A, 807B loads the DCW, processes the DCW into delay code, and queues the delay code for use by the phase interpolators 810A, 810B.

In FIG. 8, first FOD-1 802A and the second FOD-2 102B are coupled to an edge combiner 814 to provide timing signals 801 and 803 for processing (e.g., for combining the edges of the timing signals to increase a frequency of the timing signals 801 and 803). The first FOD-1 802A and the second FOD-2 102B are powered by a custom digital LDO 816, a phase interpolator (PI) LDO 818, and a comparator LDO 820. In this example, the integer divider 804A, the integer divider 804B, the DAC logic circuitry 807A, and the DAC logic circuitry 807B share the custom digital LDO 816. For example, the custom digital LDO 816 supplies power to the integer divider 804A, the integer divider 804B, the DAC logic circuitry 807A, and the DAC logic circuitry 807B.

In FIG. 8, the first FOD-1 802A and the second FOD-2 802B are operating in parallel, such that during a first time, the first FOD-1 802A may be generating a delay on the input oscillating signal (e.g., executing a phase interpolation operation), based on a timebase control parameter (e.g., a control parameter N) and a delay control word that enable generation of a ramp voltage 805 at the output of the phase interpolator 810A, to generate the timing signal 801. During the first time, the DAC logic circuitry 807A may be loading and/or processing a delay control word from the DSM 806B. During this first time, the activity of both FODs 802A and 802B may introduce cross talk. As used herein, cross talk is the unwanted transfer of signals between communication channels, such as between the two FODs 802A and 802B. In some examples, cross talk occurs when the FODs 802A and 802B share an LDO, such as the custom digital LDO 816, for supplying voltage to the integer dividers 804A, 804B and the DAC logic circuitry 807A, 807B. For example, when the first FOD-1 802A is performing delay modulation (e.g., phase interpolation) and the second FOD-2 802B is loading code (e.g., processing a delay control word), the output of the shared custom digital LDO 816 is dependent on the operation of the two FODs 802A and 802B, which can corrupt the FOD operation. Such an example of FOD corruption is illustrated in FIG. 9 below.

Figure 9:
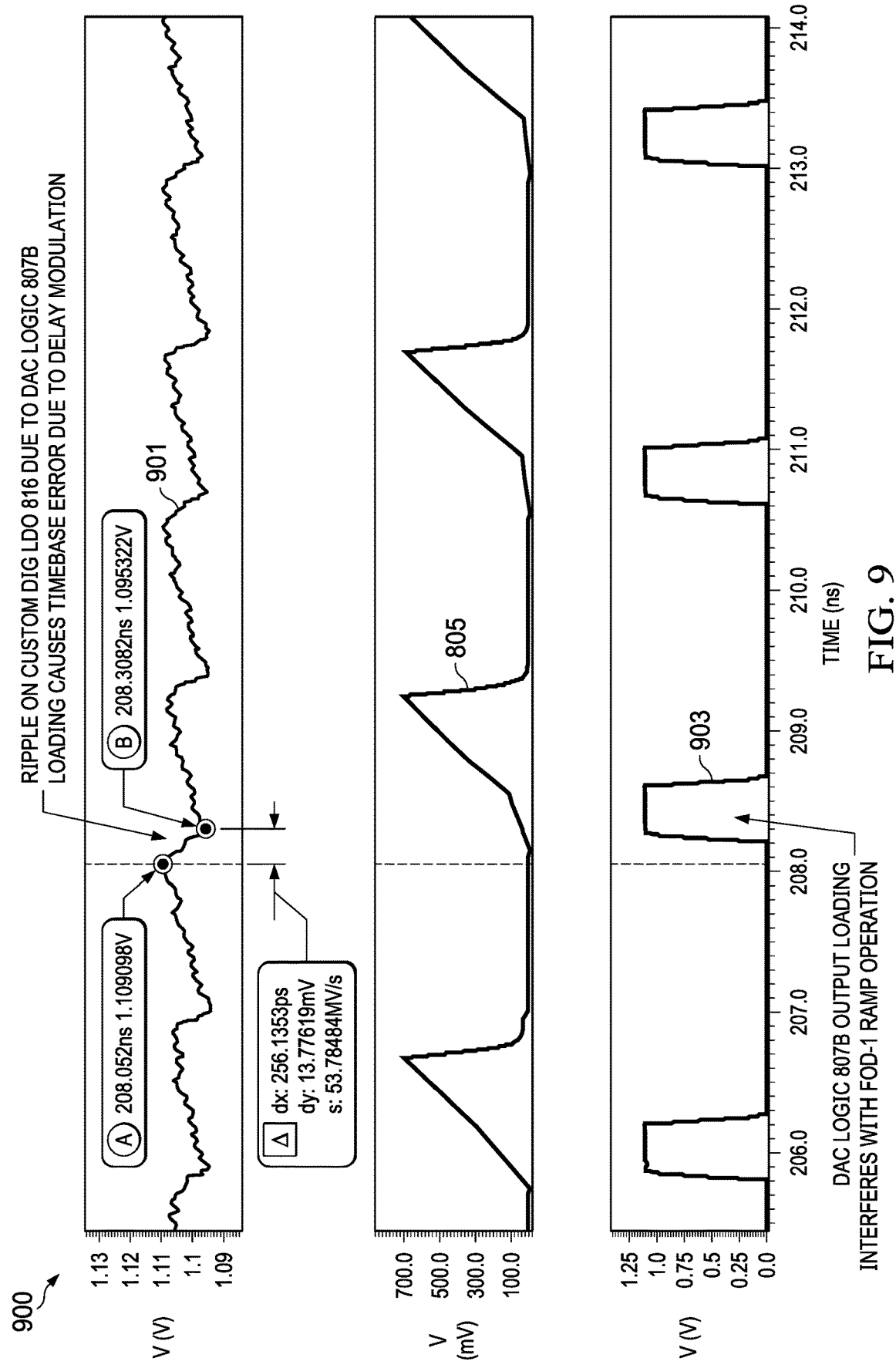
FIG. 9 is a signal plot (where voltage is plotted on the y-axis and time is plotted on the x-axis) depicting voltages at the first FOD and the second FOD of FIG. 8 during an FOD operation.

FIG. 9 is a signal plot 900 depicting voltages at the first FOD-1 802A and the second FOD-2 802B of FIG. 8 during FOD operation. The signal plot 900 illustrates how cross talk between the FODs 802A and 802B effect the operation of the first FOD 802A. The example signal plot 900 includes an example LDO output signal 901, the example ramp voltage 805 output by the phase interpolator 810A of the first FOD-1 802A, and an example DAC logic signal 903. In FIG. 9, the LDO output signal 901 corresponds to the output of the custom digital LDO 816 of FIG. 8 during operation of the FODs 802A and 802B, the ramp voltage 805 corresponds to the ramp operation generated by the phase interpolator 810A of FIG. 8, and the DAC logic signal 903 corresponds to the voltage at the DAC logic circuitry 807B, generated in response to the DCW output by the DSM 806B of the second FOD-2 802B.

In the example signal plot 900, when the DAC logic circuitry 807B of the second FOD-2 802B loads and/or processes delay control words, the voltage at the DAC logic circuitry 807B, depicted by the DAC logic signal 903, is a pulse. Simultaneously, the integer divider 804A provides timing signals (e.g., Nth clock signals) to the phase interpolator 810A responsive to the control parameter N from the DSM 806A, which generates a ramp voltage 805 in response to the first FOD-1 802A executing phase interpolation. A ripple voltage is generated at the LDO output signal 901 responsive to the custom digital LDO 816 providing power to both the integer divider 804A and the DAC logic circuitry 807B to generate timing signals and simultaneously load delay code. The pulse of the DAC logic signal 903 indirectly interferes with the ramp operation of the first FOD-1 802A, responsive to the ripple voltage at the LDO output signal 901. Such an interference can corrupt the operation of the first FOD-1 802A (e.g., can cause undesired delay modulation of the input oscillating signal).

Figure 10:
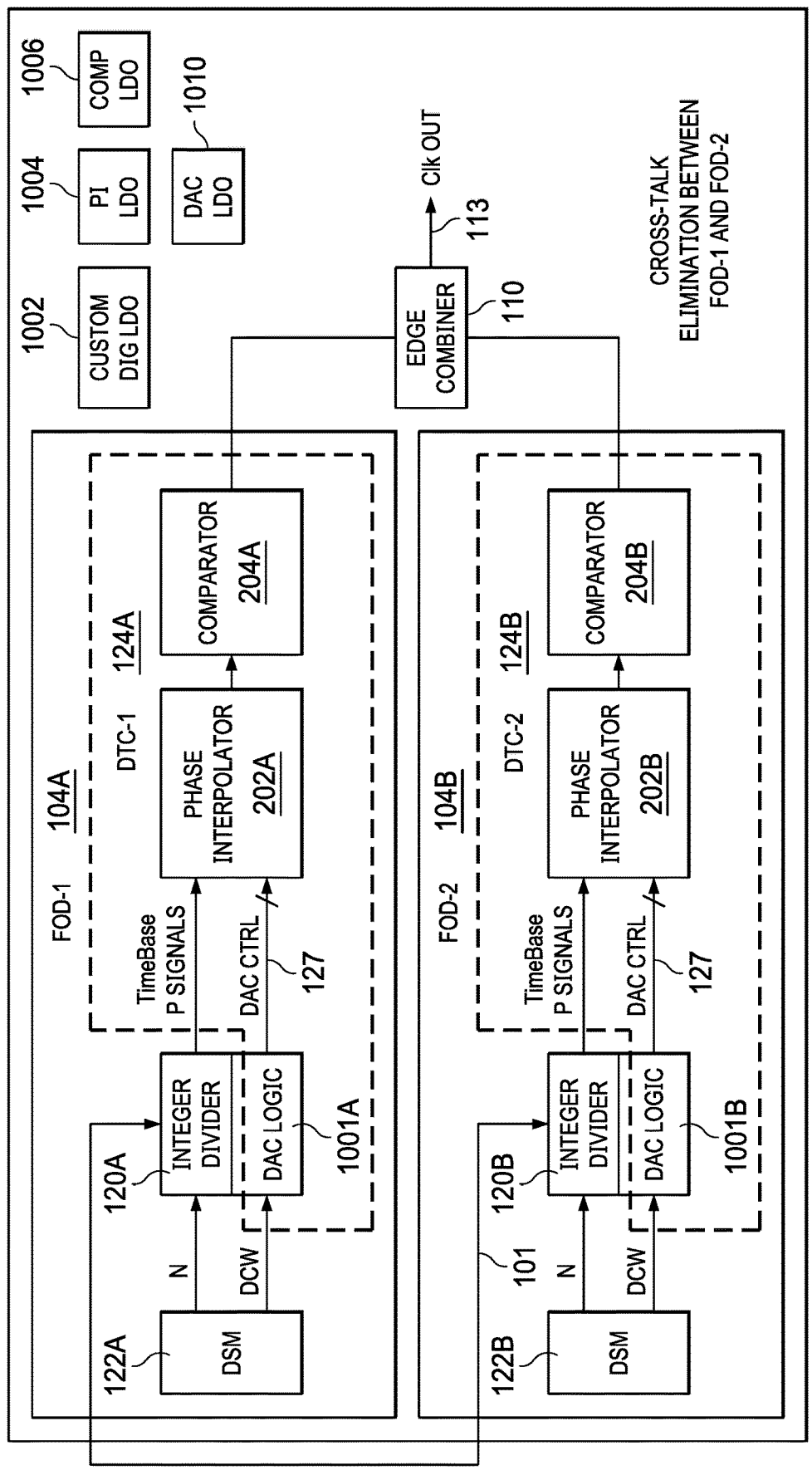
FIG. 10 is a block diagram of example FODs of FIG. 1 that include custom low dropout regulators to eliminate cross talk while operating in parallel to generate timing signals.

FIG. 10 is an example block diagram of the FODs 104 of FIG. 1 that include custom LDOs to eliminate cross talk between the FODs when operating in parallel. The example block diagram of FIG. 10 includes an example first FOD 104A, an example second FOD 104B, and the example edge combining controller 110 of FIG. 1. In FIG. 10, the example first FOD 104A includes an example first integer divider 120A, an example first DSM 122A, and an example first DTC 124A. The example first DTC 124A includes an example first phase interpolator (PI) 202A, an example first comparator 204A, and an example first DAC logic circuitry 1001A. In FIG. 10, the example second FOD 104B includes an example second integer divider 120B, an example second DSM 122B, and an example second DTC 124B. The example second DTC 124B includes an example second phase interpolator (PI) 202B, an example second comparator 204B, and an example second DAC logic circuitry 1001B. In FIG. 10, the first FOD 104A and the second FOD 104B include and/or are configured to be coupled to an example custom digital LDO 1002, an example PI LDO 1004, an example comparator LDO 1006, and an example DAC LDO 1010.

The example first integer divider 120A and the example second integer divider 120B may be implemented by the integer divider 120 of FIG. 1. The example first DSM 122A and the example second DSM 122B may be implemented by the DSM 122 of FIGS. 1 and 2. The example first phase interpolator 202A and the example second phase interpolator 202B may be implemented by the phase interpolator 202 of FIGS. 2 and 3. The example first comparator 204A and the example second comparator 204B may be implemented by the comparator 204 of FIGS. 2 and 3. In some examples, the custom digital LDO 1002, the PI LDO 1004, the comparator LDO 1006, and the DAC LDO 1010 are implemented by the LDO 106 of FIG. 1.

The example custom digital LDO 1002 is configured to supply and/or provide power (e.g., voltage) to the first integer divider 120A and the second integer divider 120B. The example PI LDO 1004 is configured to supply and/or provide power to the first PI 202A and the second PI 202B. The example comparator LDO 1006 is configured to supply and/or provide power to the first comparator 204A and the second comparator 204B. The example DAC LDO 1010 is configured to supply and/or provide power to the first DSM 122A and the second DSM 122B.

In FIG. 10, the example first DTC 124A includes the first DAC logic circuitry 1001A to process delay controls words from the first DSM 122A. For example, the first DAC logic circuitry 1001A transforms a DCW into a format that is readable by the first phase interpolator 202A. The example first phase interpolator 202A performs a phase interpolation operation responsive to obtaining a processed DCW. In some examples, the DTC 124 of FIGS. 1, 2, and 3 may include such DAC logic circuitry. For example, the DAC logic circuitry may be implemented by the DTC 124 of FIGS. 1, 2, and 3 to transform the DCW 127 into a format that is interpretable by the phase interpolator 202 of the DTC 124.

In FIG. 10, the example second DTC 124B includes the second DAC logic circuitry 1001B to process delay controls words from the second DSM 122B. For example, the second DAC logic circuitry 1001B transforms a DCW into a format that is readable by the second phase interpolator 202B. The example second phase interpolator 202B performs a phase interpolation operation responsive to obtaining a processed DCW.

The example first FOD 104A and the example second FOD 104B advantageously obtain first custom power for the first integer divider 120A and the second integer divider 120B and second custom power for the first DAC logic circuitry 1001A and the second DAC logic circuitry 1001B. Such custom power between the integer dividers 120A, 120B and the DAC logic circuitry 1001A, 1001B eliminate cross talk between the FODs 104A, 104B when operating in parallel and, thus, avoid corruption of the FOD operation. For example, referring back to the signal plot 900 of FIG. 9, ripple voltage is not generated at the output of the custom digital LDO 1002 of FIG. 10 as it is on the custom digital LDO 816 of FIG. 8, because only one FOD is using and/or drawing power from the custom digital LDO 1002 at a time. In this manner, when the second FOD 104B loads and/or processes a DCW at the second DAC logic circuitry 1001B and the first FOD 104A interpolates clock signals, the loading and/or processing does not interfere with the interpolation.

Figure 11:
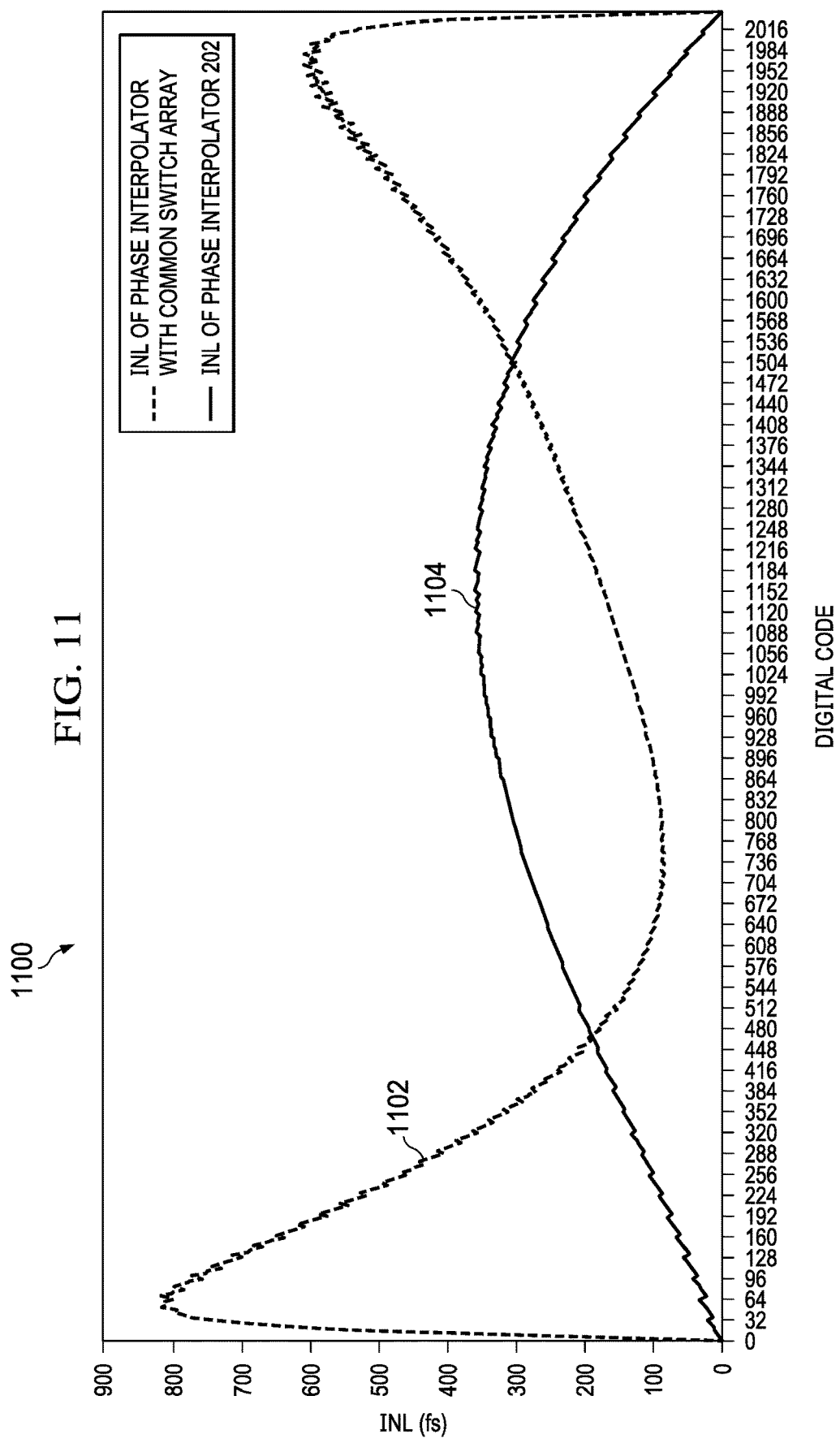
FIG. 11 is a graph of integral nonlinearity of digital to time converter output delay with respect to digital code.

FIG. 11 is a graph 1100 of integral nonlinearity INL of digital to time converter (DTC) output delay with respect to digital code. The example graph 1100 depicts the INL of the DTC delay corresponding to a phase interpolator having a common switch array and corresponding to the phase interpolator 202 of FIGS. 2 and 3 having a split commutation switch array. The example graph 1100 includes an example first INL line 1102 and an example second INL line 1104. The first INL line 1102 corresponds to the nonlinearity of a phase interpolator that implements a common switch approach to interpolate between edges of clock signals. The second INL line 1104 corresponds to the nonlinearity of the phase interpolator 202 that implements a split commutation switch approach to interpolate between edges of the Nth clock signals.

The example graph 1100 includes an x-axis and ay-axis. The x-axis of the graph 1100 depicts digital code from a digital decimal value of "0" to a digital decimal value of "2016", where each digital decimal value increments from left to right on the x-axis by a factor of 32. The digital code corresponds to delay control words, a mash sequence, etc., provided to the phase interpolators. The y-axis of the graph 1100 depicts the INL in femtoseconds (fs) from zero femtoseconds to 900 femtoseconds.

In general, it is desirable to have zero femtoseconds of INL over every digital code. In reality, that is not possible. However, the phase interpolator 202 of FIGS. 2 and 3 introduces an improvement of INL over the phase interpolator having a common switch array. For example, the first INL line 1102 illustrates that at low digital codes (e.g., 0 to 192) and high digital codes (e.g., 1824 to 2016), the INL of the phase interpolator is high (e.g., between 500 and 800 femtoseconds). Such a level of INL can cause the phase interpolator having a common switch array to imprecisely delay input clock signals.

The second INL line 1104 illustrates that over all digital codes (e.g., 0 to 2016), the INL of the phase interpolator 202 is reduced relative to the INL of the phase interpolator having a common switch array. For example, the INL frequency of the phase interpolator 202 ranges from zero femtoseconds to 350 femtoseconds and does not exceed 350 femtoseconds. Such a reduction in INL frequency of the phase interpolator 202 is due to the split commutation switch array, described above in connection with FIG. 3.

Figure 12:
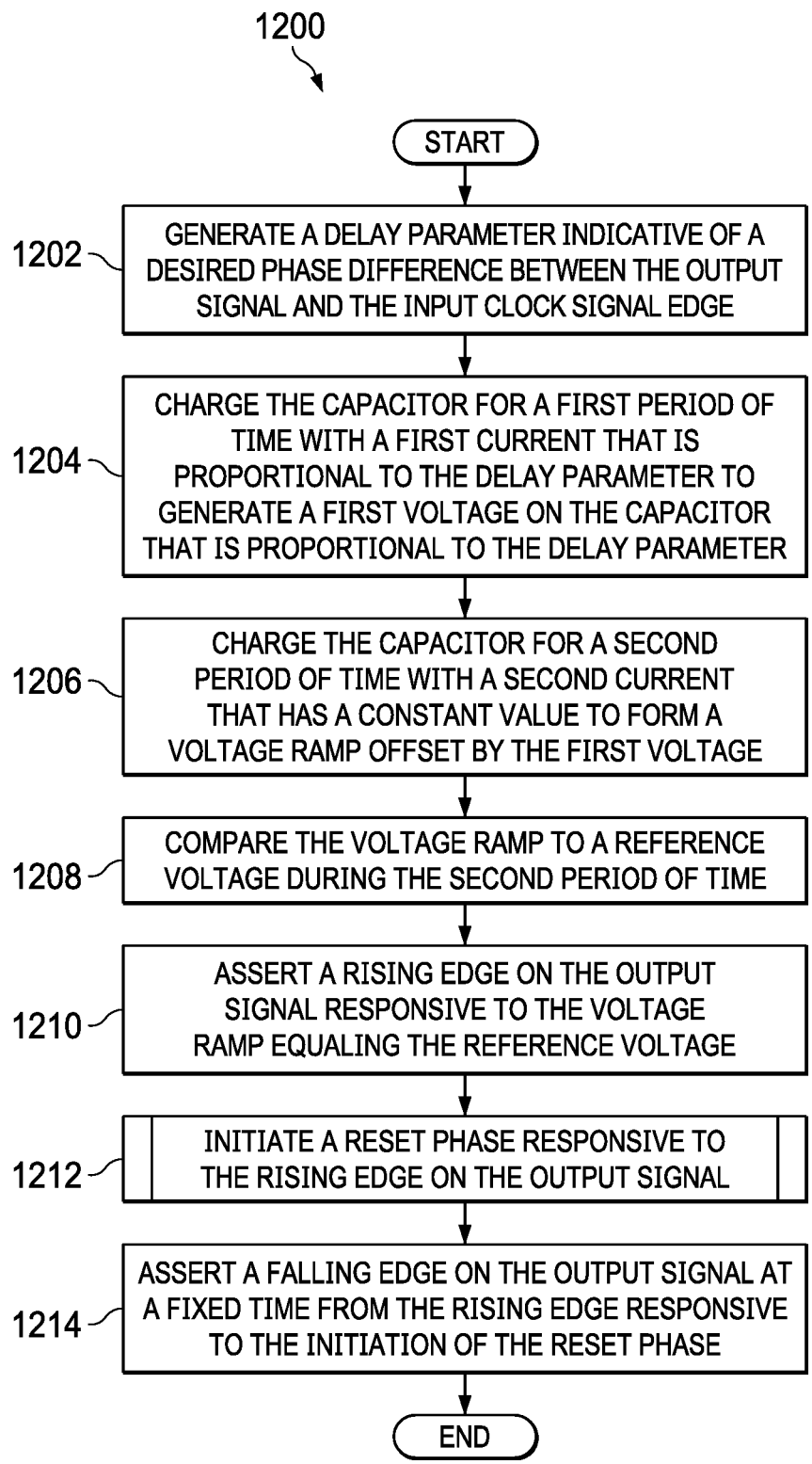

FIG. 12 is a flowchart illustrating an operation 1200 of the DTC 124 of FIGS. 1-3 to generate accurate fractional frequency clock signals from the input clock signal 101. In some examples, the fractional frequency clock signals are referred to as the intermediate signal 111.

The operation of the DTC 124 begins when the DSM 122 generates a delay parameter (e.g., DCW 127) indicative of a desired phase difference between the output signal (e.g., the intermediate signal 111) and an input clock signal edge (e.g., an edge of an Nth clock signal) (block 1202). The DSM 122 generates the DCW 127 based on digital control outputs 109 provided by digital control circuitry 108.

The first switch 304, the third switch 308, and the fourth switch 310 charge the capacitor 326 for a first period of time with a first current that is proportional to the delay parameter to generate a first voltage on the capacitor 326 that is proportional to the delay parameter (block 1204). The current source 302 may provide the first current to charge the capacitor 326 and the current source 302 generates the first current utilizing the DCW 127.

The second switch 306, the fifth switch 312, and the sixth switch 314 charge the capacitor 326 for a second period of time with a second current that has a constant value to form a voltage ramp offset by the first voltage (block 1206). For example, the current source 302 generates full and constant current which charges the capacitor 326 and generates the $PI_{out}$ voltage 201.

The comparator 328 compares the voltage ramp to reference voltage Vref 203 during the second period of time (block 1208). For example, the comparator 328 obtains the $PI_{out}$ voltage 201 generated by the capacitor 326 and compares its increasing value to the Vref voltage 203.

The comparator 328 asserts a rising edge on the output signal responsive to the voltage ramp equaling the reference voltage Vref 203 (block 1210). For example, when the $PI_{out}$ voltage 201 increases to a value that is equivalent to the reference voltage Vref 203, the comparator 328 outputs a logic one on the intermediate signal 111.

The comparator 328 initiates a reset phase responsive to the rising edge on the output signal (block 1212). For example, the rising edge on the intermediate signal 111 triggers the dynamic reset circuitry 330 to begin the reset phase. Initiating the reset phase is described in further detail below in connection with FIG. 9.

The comparator 328 asserts a falling edge on the output signal at a fixed time from the rising edge responsive to the initiation of the reset phase (block 1214). For example, the comparator 328 outputs a logic low on the intermediate signal 111 when the $PI_{out}$ voltage 201 falls below the reference voltage Vref 203.

The operation 1200 may be repeated when the DSM 122 outputs a new delay parameter to the DTC 124.

Figure 13:
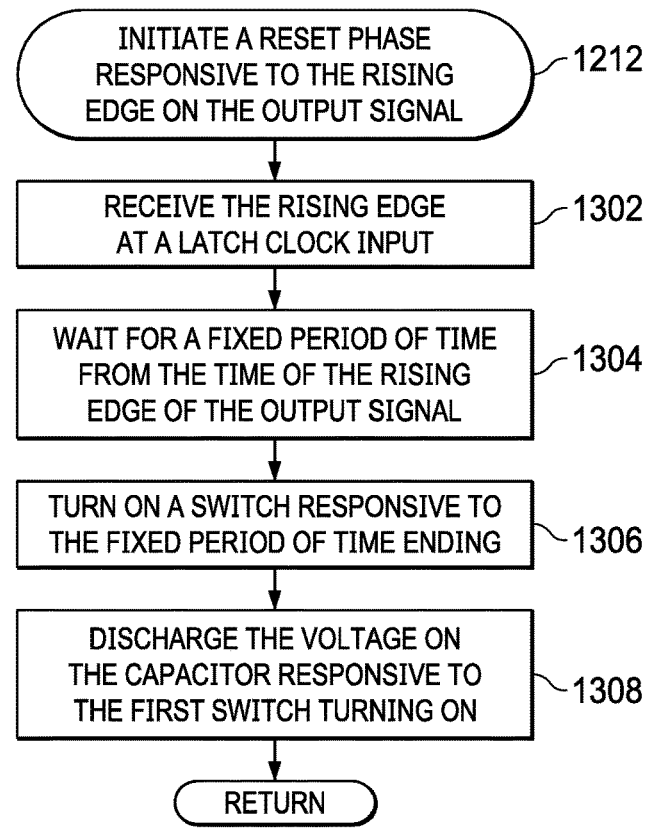
FIGS. 12 and 13 are flowcharts illustrating an operation of the digital to time converter of FIGS. 1-3.

FIG. 13 is a flowchart illustrating the initiation of the reset phase 1212 to reset the output signal. In this example, the operation of the flowchart of FIG. 13 is implemented by the dynamic reset circuitry 330 of FIG. 6. The initiation of the reset phase begins at block 1302, when the first latch 602 receives a rising edge at the latch clock input. For example, the first clock input of the first latch 602 obtains the rising edge of the intermediate signal 111.

The combination of the first latch 602, second latch 604, and third latch 606 wait for a fixed period of time from the time of the rising edge of the output signal (block 1304). For example, the first latch 602, the second latch 604, and the third latch 606 work in conjunction with one another to delay a resetting of the intermediate signal 111. In some examples, first latch 602, second latch 604, and third latch 606 are configured to operate to delay the resetting of the capacitor 326.

The third latch 606 turns on a switch responsive to the fixed period of time ending (block 1306). For example, the third latch 606 outputs a logic high to the gate of the eleventh switch 332 after a fixed period of time, which turns on the eleventh switch 332.

The eleventh switch 332 discharges the voltage on the capacitor 326 responsive to turning on (block 1308). For example, when the eleventh switch 332 turns on, the voltage of the capacitor 326 is discharged to ground, thereby resetting the capacitor 326. When the capacitor 326 discharges, the $PI_{out}$ voltage 201 decreases and the comparator 328 compares the decreasing $PI_{out}$ voltage 201 to the reference voltage Vref 203 to determine when to assert a falling edge on the intermediate signal 111.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve jitter and reduce nonlinearity for fractional output dividers (FODs). Examples disclosed herein reduce nonlinearity for fractional frequency output dividers based on implementing low current detectors in the phase interpolator to monitor slow settling nodes and discharging them when the nodes have low current flowing through them. Examples disclosed herein reduce nonlinearity based on implementing the dynamic reset circuitry in the comparator of the DTC to reset the charging capacitor a fixed period of time after the comparator outputs a rising edge to eliminate code dependent delay modulation at the comparator. Examples disclosed herein include separate phase interpolator low dropout regulators to eliminate and/or reduce cross talk between multiple FODs and/or multiple legs of the phase interpolator, which reduces systematic INL due to binary states of the gate to source voltage of the switch.

Example methods, apparatus, systems, and articles of manufacture for low jitter fractional output dividers are disclosed herein. Further examples and combinations thereof include the following:

Example 1 includes a digital to time converter (124) comprising a first switch (304) having a first current terminal, a second current terminal, and a first control terminal, the first control terminal configured to receive a control signal (D), a second switch (310) having a third current terminal, a fourth current terminal, and a second control terminal, the third current terminal coupled to second current terminal and the second control terminal configured to receive a divided clock signal (P1), a third switch (308) having a fifth current terminal, a sixth current terminal, and a third control terminal, the fifth current terminal coupled to the second current terminal and the third current terminal at a node (A) and the third control terminal configured to receive an inverted divided clock signal ($\overline{P1}$), a fourth switch (316) having a seventh current terminal, an eighth current terminal, and a fourth control terminal, the seventh current terminal coupled to the second current terminal at the node (A) and the fourth control terminal configured to receive an inverted control signal ($\overline{D}$), a fifth switch (318) having a ninth current terminal and a fifth control terminal, the ninth current terminal coupled to the eighth current terminal and the fifth control terminal configured to receive the inverted divided clock signal ($\overline{P1}$), and a capacitor (326) coupled to the sixth current terminal.

Example 2 includes the digital to time converter (124) of example 1, wherein the digital to time converter (124) comprises a current source (302) coupled to the first current terminal, the current source (302) configured to provide a current proportional to a delay parameter (DCW) representative of a percentage of a time period to shift a phase of an output clock signal (101) with respect to the divided clock signal (P1).

Example 3 includes the digital to time converter (124) of example 1, wherein the divided clock signal (P1) is a first divided clock signal and the node (A) is a first node, the digital to time converter (124) further comprising a sixth switch (306) having an eleventh current terminal, a twelfth current terminal, and a sixth control terminal, the eleventh current terminal coupled to the first current terminal and the sixth control terminal configured to receive an inverted control signal ($\overline{D}$), a seventh switch (314) having a thirteenth current terminal, a fourteenth current terminal, and a seventh control terminal, the thirteenth current terminal coupled to twelfth current terminal, the fourteenth current terminal coupled to the fourth current terminal at a second node (305), the seventh control terminal configured to receive a second divided clock signal (P2), an eighth switch (312) having a fifteenth current terminal, a sixteenth current terminal, and an eighth control terminal, the fifteenth current terminal coupled to the twelfth current terminal and the thirteenth current terminal at a third node (B), the sixteenth current terminal coupled to the sixth current terminal at a fourth node (303), and the eighth control terminal configured to receive an inverted second divided clock signal ($\overline{P2}$), a ninth switch (320) having a seventeenth current terminal, an eighteenth current terminal, and a ninth control terminal, the seventeenth current terminal coupled to the twelfth current terminal at the third node (B) and the ninth control terminal configured to receive the control signal (D), and a tenth switch (322) having a nineteenth current terminal and a tenth control terminal, the nineteenth current terminal coupled to the eighteenth current terminal and the tenth control terminal configured to receive the inverted second divided clock signal ($\overline{P2}$).

Example 4 includes the digital to time converter (124) of example 1, further comprising a resistor (324) coupled to the fourth current terminal.

Example 5 includes the digital to time converter (124) of example 1, further comprising a sixth switch (332) having an eleventh current terminal, a twelfth current terminal, and a sixth control terminal, the eleventh current terminal coupled to the capacitor (326), a comparator (328) having a first input, a second input, and a first output, the first input coupled to the capacitor (326), a voltage reference (206) coupled to the second input, and dynamic reset circuitry (330) including a third input and a second output, the third input coupled to the first output and the second output coupled to the sixth control terminal.

Example 6 includes the digital to time converter (124) of example 1, further comprising a comparator (328) having a first input, a second input, and a first output (111), the first input coupled to the capacitor (326), a voltage reference (206) coupled to the second input, and dynamic reset circuitry (330) including a first latch (602) having a first data input, a first clock input, a first latch output, and a first preset input, the first clock input coupled to the first output (111), a second latch (604) having a second data input, a second clock input, and a second latch output, the second clock input configured to receive an oscillating signal (101), the second latch output coupled to the first preset input, a third latch (606) having a third data input, a third clock input, a third latch output, and a second preset input, the third data input coupled to the second data input, the third clock input configured to receive the oscillating signal (101) and the second preset input coupled to the first latch output, and a sixth switch (332) having an eleventh current terminal and a sixth control terminal, the eleventh current terminal coupled to the capacitor (326) and the sixth control terminal coupled to the third latch output.

Example 7 includes the digital to time converter (124) of example 1, further comprising an integral nonlinearity calibration digital to analog converter (208) having a first output and a second output, the first output coupled to the fourth current terminal and the second output coupled to the sixth current terminal.

Example 8 includes the digital to time converter (124) of example 1, wherein the first switch (304), the second switch (310), and the third switch (308) comprise P-channel metal-oxide-semiconductor field-effect transistors (MOSFETs) and the fourth switch (316) and fifth switch (318) comprise N-channel MOSFETs.

Example 9 includes the digital to time converter (124) of example 1, wherein the first switch (304), second switch (310), third switch (308), fourth switch (316), and fifth switch (318) comprise a leg of a phase interpolator (202), the phase interpolator (202) to include a number of legs to implement a 12-bit digital to analog converter.

Example 10 includes the digital to time converter of example 9, wherein the number of legs of the phase interpolator (202) form a switch commutation array to reduce non-linearity of the digital to time converter (124).

Example 11 includes a system adapted to be coupled to an oscillator (102) and operable to receive an oscillating signal (101) from the oscillator (102), the system comprising a first fractional output divider (104) including a first input and a first output (111), the first input adapted to be coupled to an output of the oscillator (102) and the first fractional output divider (104) operable to generate a first output clock signal that has a first frequency equal to a fraction of the oscillating signal (101), a second fractional output divider including a second input, a second output, and a third output, the second input adapted to be coupled to the output of the oscillator (102) and the second fractional output divider operable to generate a second output clock signal at the first frequency, an edge combining controller (110) including a third input, a fourth input, and a fourth output, the third input coupled to the first output (111) and the fourth input coupled to the second output, the edge combining controller (110) operable to combine edges of the first output clock signal and the second output clock signal to generate an output clock signal having a second frequency different than the first frequency, and a multiplexer (112) having a fifth input, a sixth input, a select input (115), and a fifth output, the fifth input coupled to the third output, the sixth input coupled to the fourth output, and the multiplexer operable to select between the fifth input and the sixth input for forwarding to the fifth output responsive to a logic signal received at the select input.

Example 12 includes the system of example 11, further comprising digital control circuitry (108) coupled to the first fractional output divider (104) and the second fractional output divider to provide the fraction of the oscillating signal (101).

Example 13 includes the system of example 11, further comprising a frequency compensation sub-system (118) coupled to the first fractional output divider (104) and the second fractional output divider, the frequency compensation sub-system (118) to monitor a temperature of the oscillator (102) to provide the fraction of the oscillating signal (101).

Example 14 includes the system of example 11, wherein the second frequency is a greater frequency than the first frequency and the multiplexer (112) is to select the second frequency responsive to the first frequency falling below a threshold frequency.

Example 15 includes the system of example 11, wherein the first fractional output divider (104) further comprises an integer divider (120) coupled to the output of the oscillator (102), a delta sigma modulator (122) coupled to the integer divider (120), the delta sigma modulator (122) to provide a control parameter (N 125) to the integer divider based (120) on the fraction of the oscillating signal (101), the control parameter (N 125) to be used to generate divided clock signals (P1, P2), a digital to time converter (124) coupled to the integer divider (120), the delta sigma modulator (122), and the edge combining controller (110), the digital to time converter (124) to receive a delay parameter (DCW 127) from the delta sigma modulator (122) based on the fraction of the oscillating signal (101) and to receive the divided clock signals (P1, P2) from the integer divider (120) to delay based on the delay parameter (DCW 127) for generating the first output clock signal, and a low dropout regulator (106) configured to be coupled to the integer divider (120), the delta sigma modulator (122), and the digital to time converter (124), the low dropout regulator (106) to provide a custom supply voltage to the integer divider (120), the delta sigma modulator (122), and the digital to time converter (124).

Example 16 includes the system of example 11, wherein the second fractional output divider (104) further comprises an integer divider (120) coupled to the output of the oscillator (102), a delta sigma modulator (122) coupled to the integer divider (120), the delta sigma modulator (122) to provide a control parameter (N 125) to the integer divider (120) based on the fraction of the oscillating signal (101), the control parameter (N 125) to be used to generate divided clock signals, a digital to time converter (124) coupled to the integer divider (120), the delta sigma modulator (122), and the edge combining controller (110), the digital to time converter (124) to receive a delay parameter (DCW 127) from the delta sigma modulator (122) based on the fraction of the oscillating signal (101) and to receive the divided clock signals (P1, P2) from the integer divider (120) to delay based on the delay parameter (DCW 127) for generating the first output clock signal, and a low dropout regulator (106) configured to be coupled to the integer divider (120), the delta sigma modulator (122), and the digital to time converter (124), the low dropout regulator (106) to provide a custom supply voltage to the integer divider (120), the delta sigma modulator (122), and the digital to time converter (124).

Example 17 includes the system of example 11, wherein the first fractional output divider (104) or the second fractional output divider further comprises a delta sigma modulator (122) to generate a control parameter (N 125) and a delay control word (DCW 127) to generate divided clock signals (P1, P2), the control parameter (N 125) and the delay control word (DCW 127) generated based on the fraction of the oscillating signal (101), the delta sigma modulator (122) further including a gain corrector (128) to monitor a gain error of the first fractional output divider (104) or the second fractional output divider, the gain error corresponding to the fraction of the oscillating signal (101) having a greater time value than a period of the oscillating signal (101), and an elastic mash generator (226) to adjust the fraction of the oscillating signal (101) to a value that corrects the gain error.

Example 18 includes a method comprising generating a delay parameter (DCW) indicative of a phase difference between an output signal (111) and an input clock signal (101) edge, charging a capacitor (326) for a first period of time with a first current that is proportional to the delay parameter (DCW) to generate a first voltage on the capacitor (326) that is proportional to the delay parameter (DCW), charging the capacitor (326) for a second period of time with a second current that has a constant value to form a voltage ramp offset by the first voltage, comparing the voltage ramp to a reference voltage (206) during the second period of time, asserting a rising edge on the output signal (111) responsive to the voltage ramp equaling the reference voltage (206), and initiating a reset phase responsive to the rising edge on the output signal (111), and asserting a falling edge on the output signal (111) at a fixed time from the rising edge responsive to the initiation of the reset phase.

Example 19 includes the method of example 18, further comprising discharging the capacitor (326) at the fixed time to discharge the voltage ramp responsive to initiating the reset phase, and comparing the voltage ramp to the reference voltage (206) at the fixed time from the rising edge to assert the falling edge on the output signal (111).

Example 20 includes the method of example 18, further comprising monitoring a first state of a first switch (304) providing the first current or the second current to a first slow settling node (A) during a third period of time after the first and second periods of time, dissipating the first current or the second current at the first slow settling node (A) responsive to detecting that the first state of the first switch (304) transitioned from an on state to an off state to prevent a long settling of current at the first slow settling node (A), monitoring a second state of a second switch (306) providing the first current or the second current to a second slow settling node (B) during the third period of time after the first and second periods of time, and dissipating the first current or the second current at the second slow settling node (B) responsive to detecting that the second state of the second switch (306) transitioned from the on state to the off state to prevent the long settling of current at the second slow settling node (B).

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular circuits/circuit blocks are described herein, alternative circuitry may be utilized. For example, a processor may be used in place of a state-machine and vice versa and/or a processor may be used to implement multiple circuits. Circuits described herein are reconfigurable to include the replaced components to provide functionality at least partially similar to functionality available prior to the component replacement.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described embodiments, and other embodiments are possible, within the scope of the claims.

What is claimed is:

1. A digital to time converter (DTC) comprising:
a first switch having a first current terminal, a second current terminal, and a first control terminal, the first control terminal configured to receive a control signal;
a second switch having a third current terminal, a fourth current terminal, and a second control terminal, the third current terminal coupled to second current terminal and the second control terminal configured to receive a divided clock signal;
a third switch having a fifth current terminal, a sixth current terminal, and a third control terminal, the fifth current terminal coupled to the second current terminal and the third current terminal at a node and the third control terminal configured to receive an inverted version of the divided clock signal;
a fourth switch having a seventh current terminal, an eighth current terminal, and a fourth control terminal, the seventh current terminal coupled to the second current terminal at the node and the fourth control terminal configured to receive an inverted version of the control signal;
a fifth switch having a ninth current terminal and a fifth control terminal, the ninth current terminal coupled to the eighth current terminal and the fifth control terminal configured to receive the inverted version of the divided clock signal; and
a capacitor coupled to the sixth current terminal.

2. The digital to time converter of claim 1, wherein the digital to time converter comprises a current source coupled to the first current terminal, the current source configured to provide a current proportional to a delay parameter representative of a percentage of a time period to shift a phase of an output clock signal with respect to the divided clock signal.

3. The digital to time converter of claim 1, wherein the divided clock signal is a first divided clock signal, and the node is a first node, the digital to time converter further comprising:
a sixth switch having an eleventh current terminal, a twelfth current terminal, and a sixth control terminal, the eleventh current terminal coupled to the first current terminal and the sixth control terminal configured to receive an inverted control signal;
a seventh switch having a thirteenth current terminal, a fourteenth current terminal, and a seventh control terminal, the thirteenth current terminal coupled to twelfth current terminal, the fourteenth current terminal coupled to the fourth current terminal at a second node, the seventh control terminal configured to receive a second divided clock signal;
an eighth switch having a fifteenth current terminal, a sixteenth current terminal, and an eighth control terminal, the fifteenth current terminal coupled to the twelfth current terminal and the thirteenth current terminal at a third node, the sixteenth current terminal coupled to the sixth current terminal at a fourth node, and the eighth control terminal configured to receive an inverted second divided clock signal;
a ninth switch having a seventeenth current terminal, an eighteenth current terminal, and a ninth control terminal, the seventeenth current terminal coupled to the twelfth current terminal at the third node and the ninth control terminal configured to receive the control signal; and
a tenth switch having a nineteenth current terminal and a tenth control terminal, the nineteenth current terminal coupled to the eighteenth current terminal and the tenth control terminal configured to receive the inverted second divided clock signal.

4. The digital to time converter of claim 1, further comprising a resistor coupled to the fourth current terminal.

5. The digital to time converter of claim 1, further comprising:
a sixth switch having an eleventh current terminal, a twelfth current terminal, and a sixth control terminal, the eleventh current terminal coupled to the capacitor;
a comparator having a first input, a second input, and a first output, the first input coupled to the capacitor;
a voltage reference coupled to the second input; and
dynamic reset circuitry including a third input and a second output, the third input coupled to the first output and the second output coupled to the sixth control terminal.

6. The digital to time converter of claim 1, further comprising:
a comparator having a first input, a second input, and a first output, the first input coupled to the capacitor;
a voltage reference coupled to the second input; and dynamic reset circuitry including:
- a first latch having a first data input, a first clock input, a first latch output, and a first preset input, the first clock input coupled to the first output;
- a second latch having a second data input, a second clock input, and a second latch output, the second clock input configured to receive an oscillating signal, the second latch output coupled to the first preset input;
- a third latch having a third data input, a third clock input, a third latch output, and a second preset input, the third data input coupled to the second data input, the third clock input configured to receive the oscillating signal and the second preset input coupled to the first latch output; and
- a sixth switch having an eleventh current terminal and a sixth control terminal, the eleventh current terminal coupled to the capacitor and the sixth control terminal coupled to the third latch output.

7. The digital to time converter of claim 1, further comprising an integral nonlinearity calibration digital to analog converter having a first output and a second output, the first output coupled to the fourth current terminal and the second output coupled to the sixth current terminal.

8. The digital to time converter of claim 1, wherein the first switch, the second switch, and the third switch comprise P-channel metal-oxide-semiconductor field-effect transistors (MOSFETs) and the fourth switch and fifth switch comprise N-channel MOSFETs.

9. The digital to time converter of claim 1, wherein the first switch, second switch, third switch, fourth switch, and fifth switch comprise a leg of a phase interpolator, the phase interpolator to include a number of legs to implement a 12-bit digital to analog converter.

10. The digital to time converter of claim 9, wherein the number of legs of the phase interpolator form a switch commutation array to reduce non-linearity of the digital to time converter.

11. A system adapted to be coupled to an oscillator and operable to receive an oscillating signal from the oscillator, the system comprising:
- a first fractional output divider including a first input and a first output, the first input adapted to be coupled to an output of the oscillator and the first fractional output divider operable to generate a first output clock signal that has a first frequency equal to a fraction of the oscillating signal;
- a second fractional output divider including a second input, a second output, and a third output, the second input adapted to be coupled to the output of the oscillator and the second fractional output divider operable to generate a second output clock signal at the first frequency;
- an edge combining controller including a third input, a fourth input, and a fourth output, the third input coupled to the first output and the fourth input coupled to the second output, the edge combining controller operable to combine edges of the first output clock signal and the second output clock signal to generate an output clock signal having a second frequency different than the first frequency; and
- a multiplexer having a fifth input, a sixth input, a select input, and a fifth output, the fifth input coupled to the third output, the sixth input coupled to the fourth output, and the multiplexer operable to select between the fifth input and the sixth input for forwarding to the fifth output responsive to a logic signal received at the select input.

12. The system of claim 11, further comprising digital control circuitry coupled to the first fractional output divider and the second fractional output divider to provide the fraction of the oscillating signal.

13. The system of claim 11, further comprising a frequency compensation sub-system coupled to the first fractional output divider and the second fractional output divider, the frequency compensation sub-system to monitor a temperature of the oscillator to provide the fraction of the oscillating signal.

14. The system of claim 11, wherein the second frequency is a greater frequency than the first frequency and the multiplexer is to select the second frequency responsive to the first frequency falling below a threshold frequency.

15. The system of claim 11, wherein the first fractional output divider further comprises:
- an integer divider coupled to the output of the oscillator;
- a delta sigma modulator coupled to the integer divider, the delta sigma modulator to provide a control parameter to the integer divider based on the fraction of the oscillating signal, the control parameter to be used to generate divided clock signals;
- a digital to time converter coupled to the integer divider, the delta sigma modulator, and the edge combining controller, the digital to time converter to receive a delay parameter from the delta sigma modulator based on the fraction of the oscillating signal and to receive the divided clock signals from the integer divider to delay based on the delay parameter for generating the first output clock signal; and
- a low dropout regulator configured to be coupled to the integer divider, the delta sigma modulator, and the digital to time converter, the low dropout regulator to provide a custom supply voltage to the integer divider, the delta sigma modulator, and the digital to time converter.

16. The system of claim 11, wherein the second fractional output divider further comprises:
- an integer divider coupled to the output of the oscillator;
- a delta sigma modulator coupled to the integer divider, the delta sigma modulator to provide a control parameter to the integer divider based on the fraction of the oscillating signal, the control parameter to be used to generate divided clock signals;
- a digital to time converter coupled to the integer divider, the delta sigma modulator, and the edge combining controller, the digital to time converter to receive a delay parameter from the delta sigma modulator based on the fraction of the oscillating signal and to receive the divided clock signals from the integer divider to delay based on the delay parameter for generating the first output clock signal; and
- a low dropout regulator configured to be coupled to the integer divider, the delta sigma modulator, and the digital to time converter, the low dropout regulator to provide a custom supply voltage to the integer divider, the delta sigma modulator, and the digital to time converter.

17. The system of claim 11, wherein the first fractional output divider or the second fractional output divider further comprises:
- a delta sigma modulator to generate a control parameter and a delay control word to generate divided clock signals, the control parameter and the delay control word generated based on the fraction of the oscillating signal, the delta sigma modulator further including:
a gain corrector to monitor a gain error of the first fractional output divider or the second fractional output divider, the gain error corresponding to the fraction of the oscillating signal having a greater time value than a period of the oscillating signal; and
an elastic mash generator to adjust the fraction of the oscillating signal to a value that corrects the gain error.

18. A method comprising:

generating a delay parameter indicative of a phase difference between an output signal and an input clock signal edge;

charging a capacitor for a first period of time with a first current that is proportional to the delay parameter to generate a first voltage on the capacitor that is proportional to the delay parameter;

charging the capacitor for a second period of time with a second current that has a constant value to form a voltage ramp offset by the first voltage;

comparing the voltage ramp to a reference voltage during the second period of time;

asserting a rising edge on the output signal responsive to the voltage ramp equaling the reference voltage; and initiating a reset phase responsive to the rising edge on the output signal; and asserting a falling edge on the output signal at a fixed time from the rising edge responsive to the initiation of the reset phase.

19. The method of claim 18, further comprising:

discharging the capacitor at the fixed time to discharge the voltage ramp responsive to initiating the reset phase; and comparing the voltage ramp to the reference voltage at the fixed time from the rising edge to assert the falling edge on the output signal.

20. The method of claim 18, further comprising:

monitoring a first state of a first switch providing the first current or the second current to a first slow settling node during a third period of time after the first and second periods of time;

dissipating the first current or the second current at the first slow settling node responsive to detecting that the first state of the first switch transitioned from an on state to an off state to prevent a long settling of current at the first slow settling node;

monitoring a second state of a second switch providing the first current or the second current to a second slow settling node during the third period of time after the first and second periods of time; and dissipating the first current or the second current at the second slow settling node responsive to detecting that the second state of the second switch transitioned from the on state to the off state to prevent the long settling of current at the second slow settling node.

* * * * *